(12) United States Patent
Ishiduki et al.

(10) Patent No.: US 8,084,807 B2
(45) Date of Patent: Dec. 27, 2011

(54) NONVOLATILE SEMICONDUCTOR MEMORY DEVICE AND METHOD FOR MANUFACTURING SAME

(75) Inventors: Megumi Ishiduki, Kanagawa-ken (JP); Ryota Katsumata, Kanagawa-ken (JP); Masaru Kidoh, Tokyo (JP); Hiroyasu Tanaka, Tokyo (JP); Yosuke Komori, Kanagawa-ken (JP); Masaru Kito, Kanagawa-ken (JP); Yoshiaki Fukuzumi, Kanagawa-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 12/535,847

(22) Filed: Aug. 5, 2009

(65) Prior Publication Data

US 2010/0044776 A1 Feb. 25, 2010

(30) Foreign Application Priority Data

Aug. 19, 2008 (JP) ................................. 2008-210450

(51) Int. Cl.
*H01L 29/792* (2006.01)

(52) U.S. Cl. ........ 257/318; 257/315; 257/316; 257/324; 257/E29.309

(58) Field of Classification Search .................. 257/315, 257/316, 318, 324, E29.309
See application file for complete search history.

(56) References Cited

U.S. PATENT DOCUMENTS

| | | | | |
|---|---|---|---|---|
| 5,929,477 A * | 7/1999 | McAllister Burns et al. | 257/306 |
| 6,727,544 B2 | 4/2004 | Endoh et al. | |
| 6,870,215 B2 * | 3/2005 | Endoh et al. | 257/316 |
| 6,894,341 B2 * | 5/2005 | Sugimae et al. | 257/315 |
| 7,576,384 B2 * | 8/2009 | Gidon | 257/316 |
| 7,777,272 B2 * | 8/2010 | Youn et al. | 257/324 |
| 7,800,161 B2 * | 9/2010 | Mokhlesi | 257/319 |
| 2007/0158736 A1 | 7/2007 | Arai et al. | |
| 2007/0272973 A1 * | 11/2007 | Park et al. | 257/324 |
| 2008/0149992 A1 * | 6/2008 | Gidon | 257/316 |
| 2009/0001352 A1 * | 1/2009 | Han et al. | 257/24 |
| 2010/0059811 A1 * | 3/2010 | Sekine et al. | 257/324 |

FOREIGN PATENT DOCUMENTS

JP 2007-266143 10/2007

* cited by examiner

*Primary Examiner* — Victor A Mandala

(74) *Attorney, Agent, or Firm* — Oblon, Spivak, McClelland, Maier & Neustadt, L.L.P.

(57) ABSTRACT

A multilayer body is formed by alternately stacking electrode films serving as control gates and dielectric films in a direction orthogonal to an upper surface of a silicon substrate. Trenches extending in the word line direction are formed in the multilayer body and a memory film is formed on an inner surface of the trench. Subsequently, a silicon body is buried inside the trench, and a charge storage film and the silicon body are divided in the word line direction to form silicon pillars. This simplifies the configuration of memory cells in the bit line direction, and hence can shorten the arrangement pitch of the silicon pillars, decreasing the area per memory cell.

11 Claims, 27 Drawing Sheets

NONVOLATILE SEMICONDUCTOR MEMORY DEVICE AND METHOD FOR MANUFACTURING SAME

CROSS-REFERENCE TO RELATED APPLICATIONS

This application is based upon and claims the benefits of priority from the prior Japanese Patent Application No. 2008-210450, filed on Aug. 19, 2008; the entire contents of which are incorporated herein by reference.

BACKGROUND OF THE INVENTION

1. Field of the Invention

This invention relates to a nonvolatile semiconductor memory device and a method for manufacturing the same, and more particularly to a nonvolatile semiconductor memory device with a plurality of dielectric films and a plurality of electrode films alternately stacked therein, and a method for manufacturing the same.

2. Background Art

Higher capacity and lower cost are expected of a flash memory as a nonvolatile semiconductor memory device in the future. A common method for increasing the capacity of a flash memory is to advance lithography and other processing techniques to downscale the structure, thereby increasing the level of integration of memory cells. However, downscaling in processing techniques has already been close to the limit. It is difficult to significantly increase the capacity of a flash memory simply by relying on the advancement of processing techniques as conventional.

In this context, the technique of a three-dimensional flash memory attracts new attention. This technique can increase the capacity by stacking memory cells also in a three-dimensional direction (see JP-A-2007-266143). In such a three-dimensional flash memory, the level of integration in the plane can be increased by downscaling the planar structure, and the level of integration in the stacking direction can be increased by increasing the number of stacked layers. Thus, further downscaling the planar structure is useful for higher capacity also in a three-dimensional flash memory.

SUMMARY OF THE INVENTION

According to an aspect of the invention, there is provided a nonvolatile semiconductor memory device including: a multilayer body with a plurality of dielectric films and a plurality of electrode films alternately stacked therein and a trench that extends in one direction orthogonal to the stacking direction being formed therein; semiconductor pillars arranged along the one direction and spaced from each other inside the trench; and a charge storage film provided between the electrode film and the semiconductor pillar, the charge storage film being divided in the one direction, and being not provided between a portion between the semiconductor pillars inside the trench, and the electrode film and the dielectric film.

According to another aspect of the invention, there is provided a method for manufacturing a nonvolatile semiconductor memory device, including: forming a multilayer body by alternately stacking a plurality of dielectric films and a plurality of electrode films; forming a trench in the multilayer body, the trench extending in one direction orthogonal to the stacking direction; forming a charge storage film on an inner surface of the trench; burying a semiconductor member inside the trench; and dividing the charge storage film and the semiconductor member in the one direction.

BRIEF DESCRIPTION OF THE DRAWINGS

FIG. 17A is a plan view, and FIG. 17B is an enlarged view of portion D shown in FIG. 17A;

DETAILED DESCRIPTION OF THE INVENTION

Embodiments of the invention will now be described with reference to the drawings.

At the outset, a first embodiment of the invention is described.

The nonvolatile semiconductor memory device according to this embodiment is a three-dimensional flash memory. Briefly, this embodiment is characterized as follows. Trenches extending in the word line direction are formed in a multilayer body of electrode films, serving as control gates, and dielectric films. A charge storage film is formed on the inner surface of this trench, and a silicon body is buried in the trench. The charge storage film and the silicon body are divided in the word line direction to form silicon pillars. This simplifies the configuration of memory cells in the word line direction, and hence can decrease the cell length of the word line direction and the area per memory cell. Furthermore, in the nonvolatile semiconductor memory device thus manufactured, the charge storage film is provided only in the bit line direction as viewed from the silicon pillar, and divided in the word line direction. This serves to prevent interference between memory cells arranged in the word line direction.

This embodiment is described below in detail.

First, a method for manufacturing a nonvolatile semiconductor memory device according to this embodiment is described.

FIGS. 1A to 5B are process views illustrating the method for manufacturing the nonvolatile semiconductor memory device according to this embodiment, where FIGS. 1A, 2A, 3A, 4A, and 5A are plan views, and FIGS. 1B, 2B, 3B, 4B, and 5B are cross-sectional views taken along line A-A' shown in FIGS. 1A, 2A, 3A, 4A, and 5A, respectively.

Figure 6:
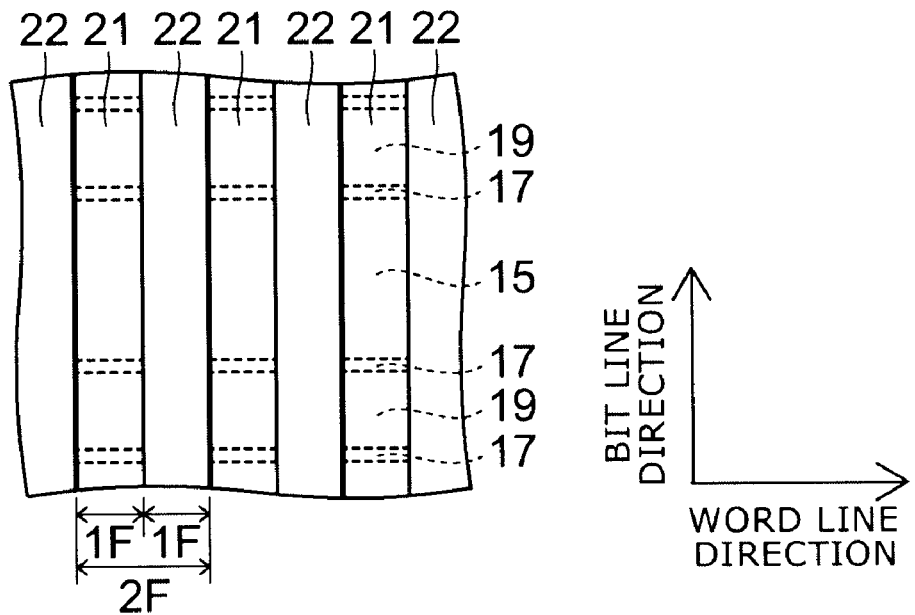
FIG. 6 is a process plan view illustrating the method for manufacturing the nonvolatile semiconductor memory device according to the first embodiment.
Figure 7:
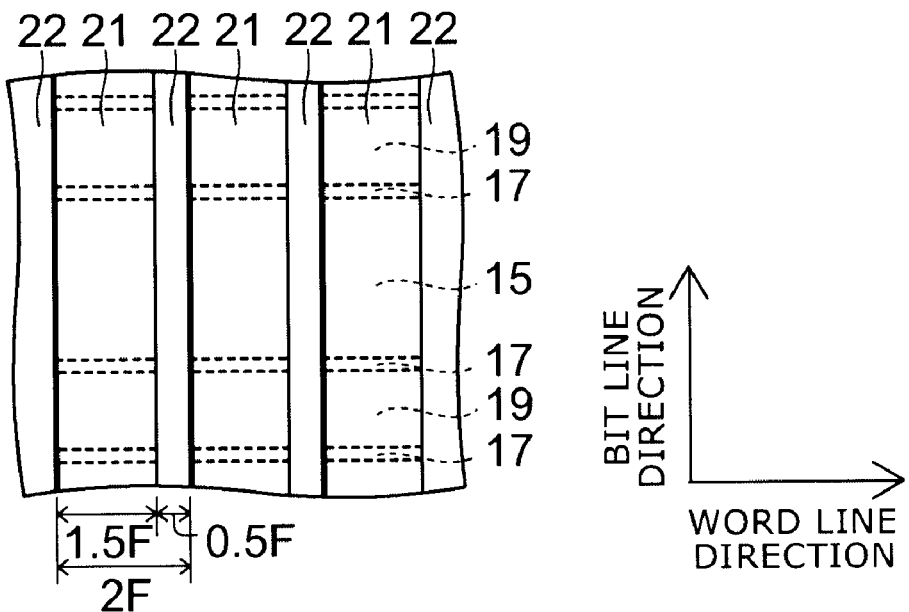
FIG. 7 is a process plan view illustrating the method for manufacturing the nonvolatile semiconductor memory device according to the first embodiment.

FIGS. 6 and 7 are process plan views illustrating the method for manufacturing the nonvolatile semiconductor memory device according to this embodiment.

Figure 8A:
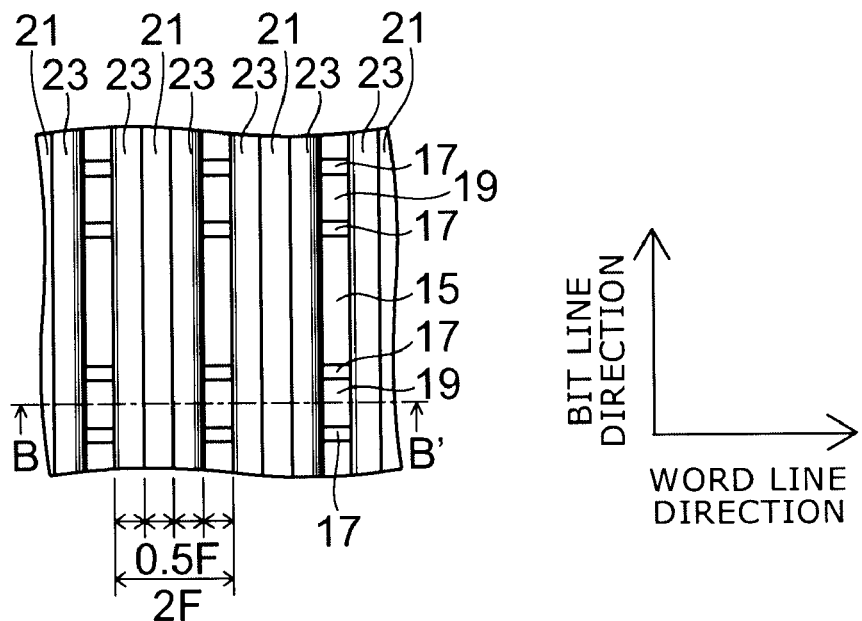
FIG. 8A is a process plan view illustrating the method for manufacturing the nonvolatile semiconductor memory device according to the first embodiment.
Figure 8B:
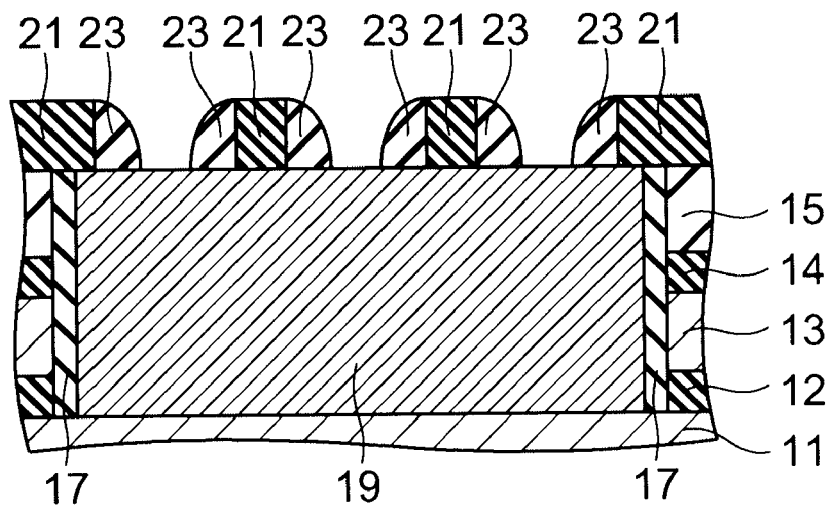
FIG. 8B is a process cross-sectional view taken along line B-B' shown in FIG. 8A.
Figure 9A:
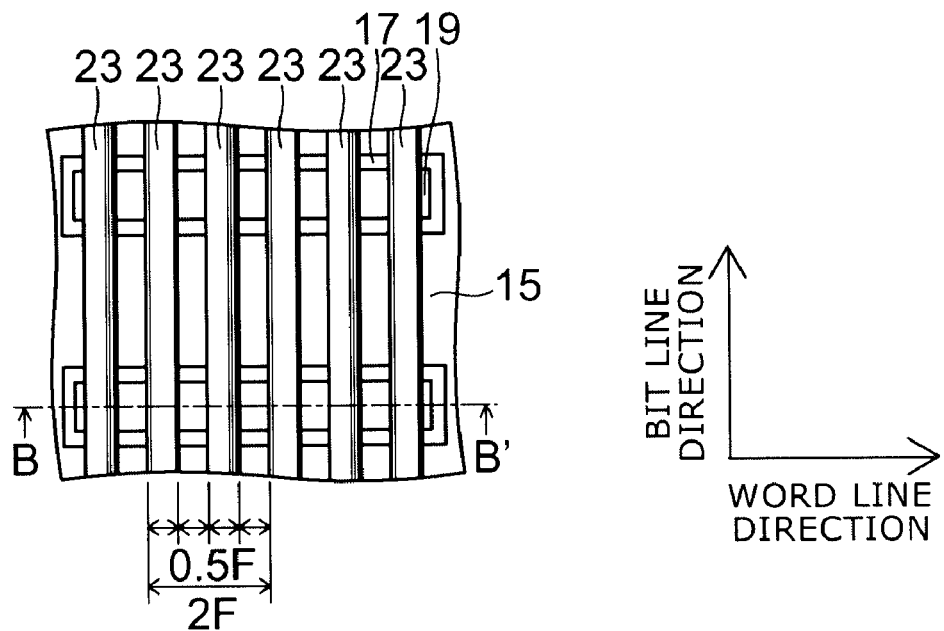
FIG. 9A is a process plan view illustrating the method for manufacturing the nonvolatile semiconductor memory device according to the first embodiment.
Figure 9B:
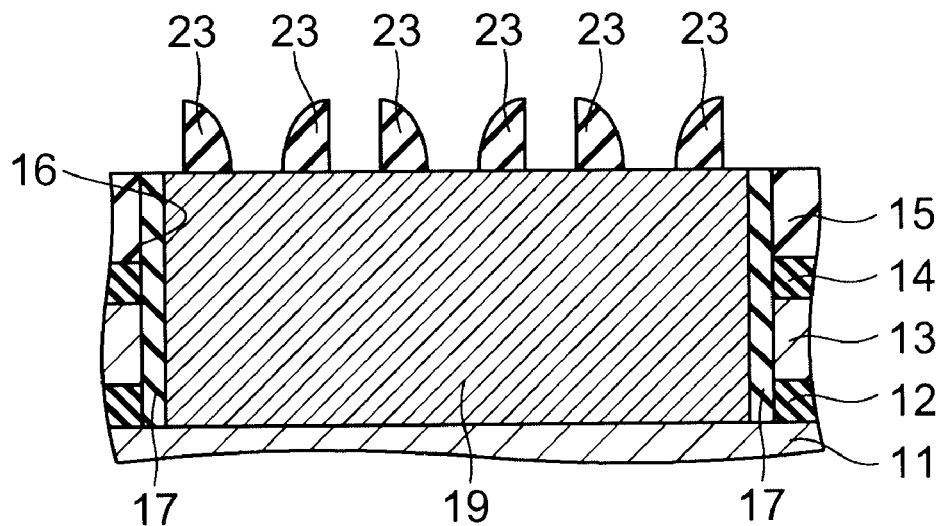
FIG. 9B is a process cross-sectional view taken along line B-B' shown in FIG. 9A.
Figure 10A:
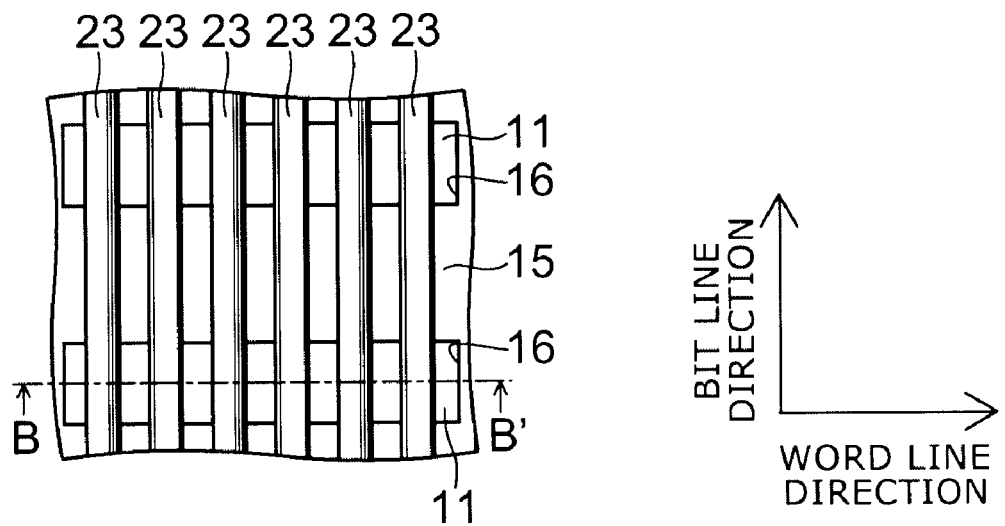
FIG. 10A is a process plan view illustrating the method for manufacturing the nonvolatile semiconductor memory device according to the first embodiment.
Figure 10B:
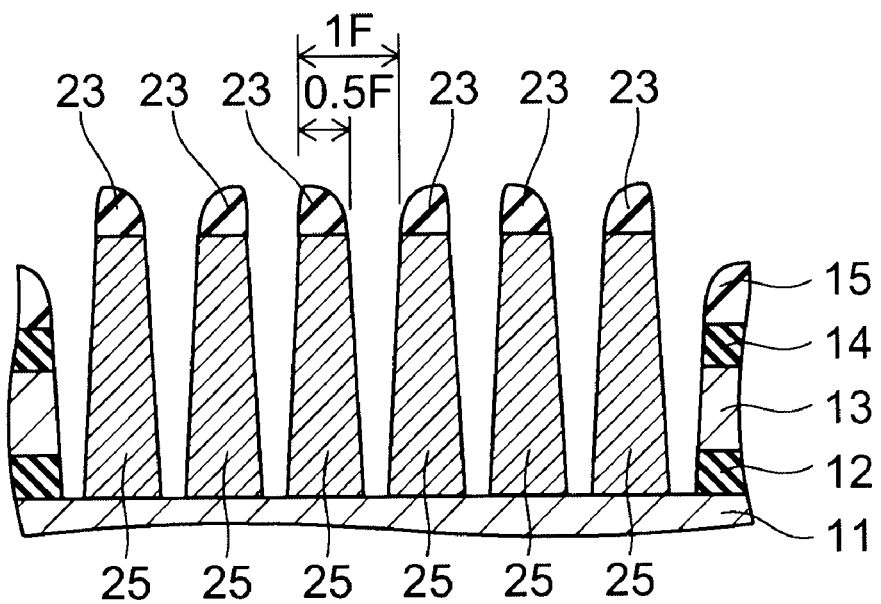
FIG. 10B is a process cross-sectional view taken along line B-B' shown in FIG. 10A.

FIGS. 8A to 10B are process views illustrating the method for manufacturing the nonvolatile semiconductor memory device according to this embodiment, where FIGS. 8A, 9A, and 10A are plan views, and FIGS. 8B, 9B, and 10B are cross-sectional views taken along line B-B' shown in FIGS. 8A, 9A, and 10A, respectively.

Figure 11A:
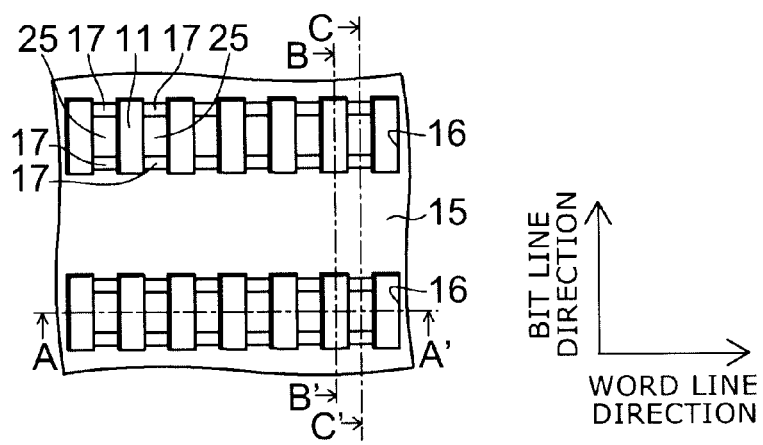
FIG. 11A is a process plan view illustrating the method for manufacturing the nonvolatile semiconductor memory device according to the first embodiment.
Figure 11B:
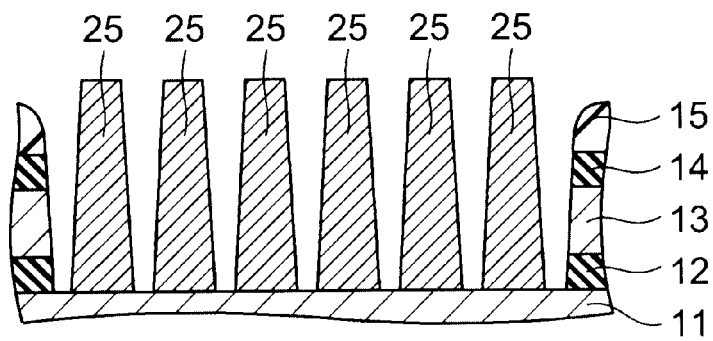
FIG. 11B is a process cross-sectional view taken along line A-A' shown in FIG. 11A.
Figure 11C:
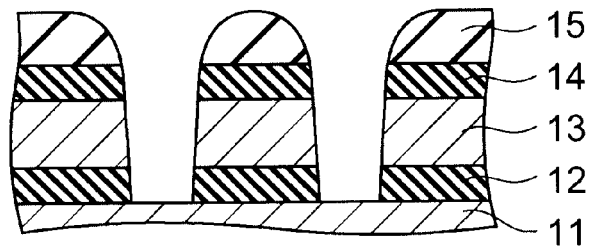
FIG. 11C is a process cross-sectional view taken along line B-B' shown in FIG. 11A.
Figure 11D:
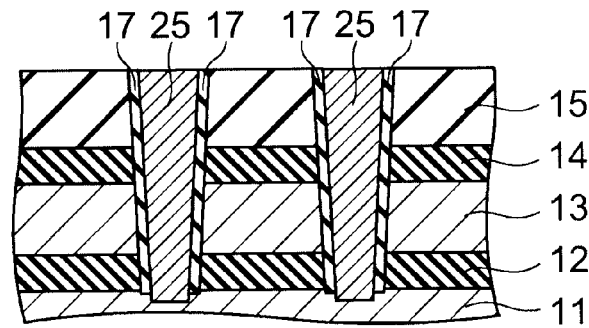
FIG. 11D is a process cross-sectional view taken along line C-C' shown in FIG. 11A.
Figure 12A:
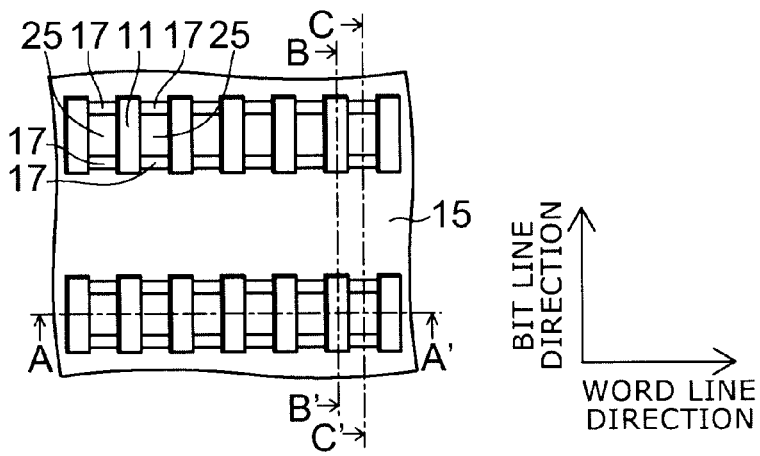
FIG. 12A is a process plan view illustrating the method for manufacturing the nonvolatile semiconductor memory device according to the first embodiment.
Figure 12B:
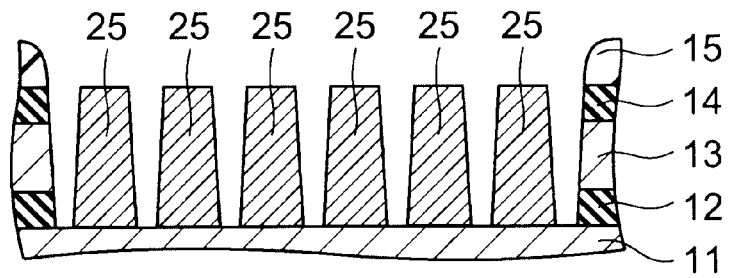
FIG. 12B is a process cross-sectional view taken along line A-A' shown in FIG. 12A.
Figure 12C:
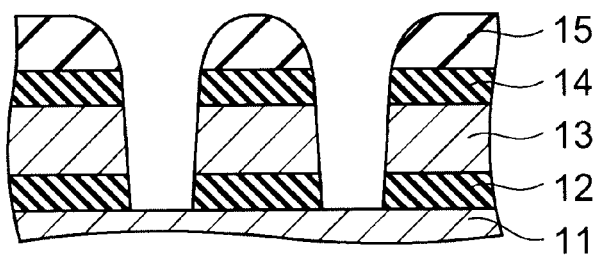
FIG. 12C is a process cross-sectional view taken along line B-B' shown in FIG. 12A.
Figure 12D:
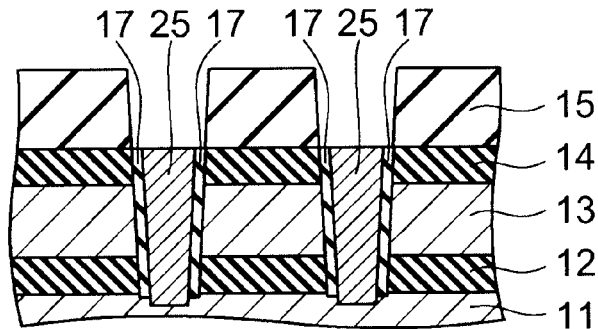
FIG. 12D is a process cross-sectional view taken along line C-C' shown in FIG. 12A.
Figure 13A:
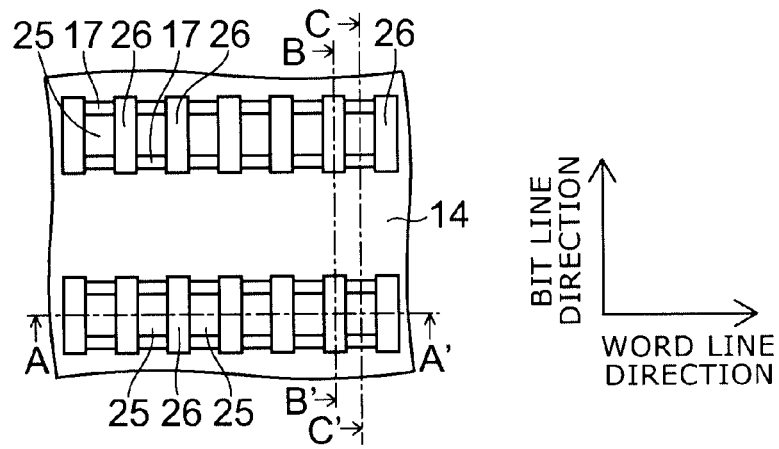
FIG. 13A is a process plan view illustrating the method for manufacturing the nonvolatile semiconductor memory device according to the first embodiment.
Figure 13B:
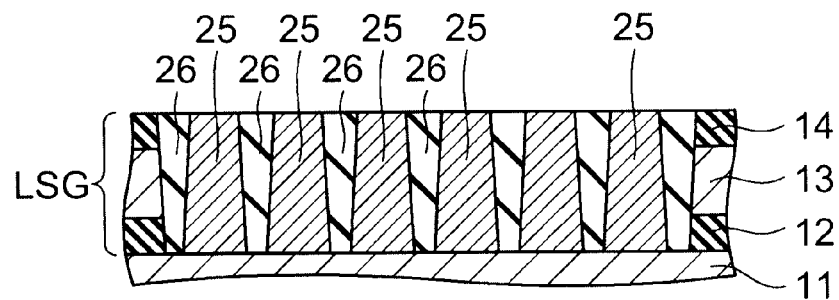
FIG. 13B is a process cross-sectional view taken along line A-A' shown in FIG. 13A.
Figure 13C:
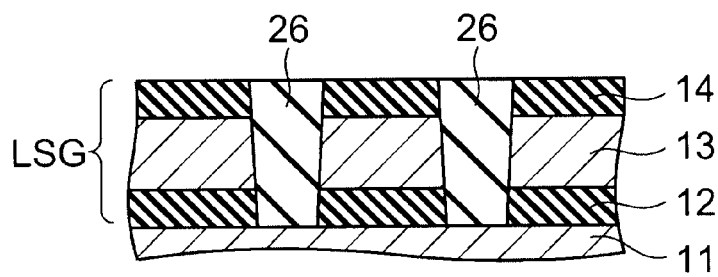
FIG. 13C is a process cross-sectional view taken along line B-B' shown in FIG. 13A.
Figure 13D:
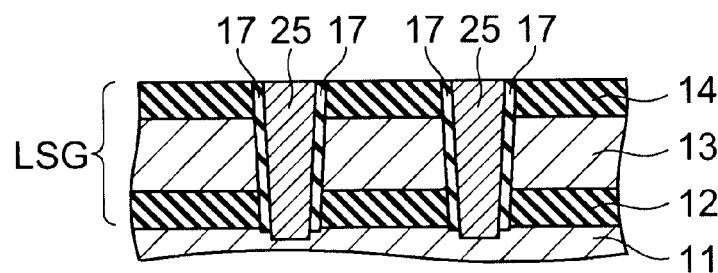
FIG. 13D is a process cross-sectional view taken along line C-C' shown in FIG. 13A.

FIGS. 11A to 13D are process views illustrating the method for manufacturing the nonvolatile semiconductor memory device according to this embodiment, where FIGS. 11A, 12A, and 13A are plan views, FIGS. 11B, 12B, and 13B are cross-sectional views taken along line A-A' shown in FIGS. 11A, 12A, and 13A, respectively, FIGS. 11C, 12C, and 13C are cross-sectional views taken along line B-B' shown in FIGS. 11A, 12A, and 13A, respectively, and FIGS. 11D, 12D, and 13D are cross-sectional views taken along line C-C' shown in FIGS. 11A, 12A, and 13A, respectively.

Figure 14A:
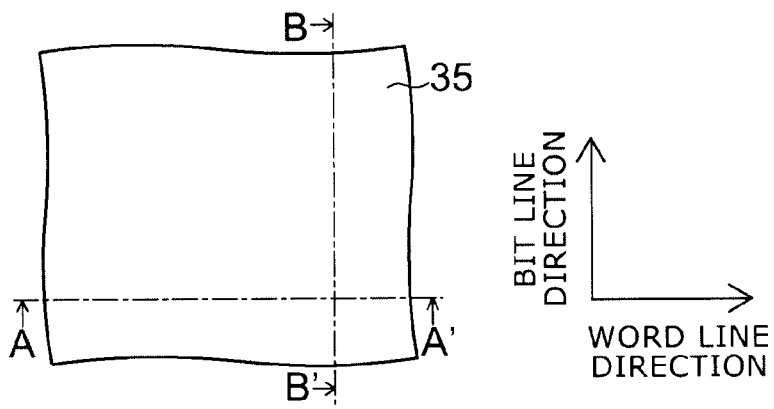
FIG. 14A is a process plan view illustrating the method for manufacturing the nonvolatile semiconductor memory device according to the first embodiment.
Figure 14B:
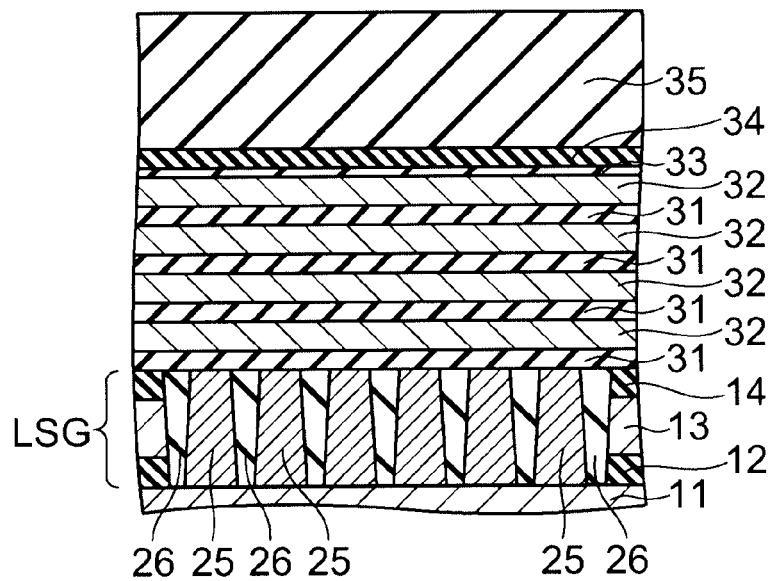
FIG. 14B is a process cross-sectional view taken along line A-A' shown in FIG. 14A.
Figure 14C:
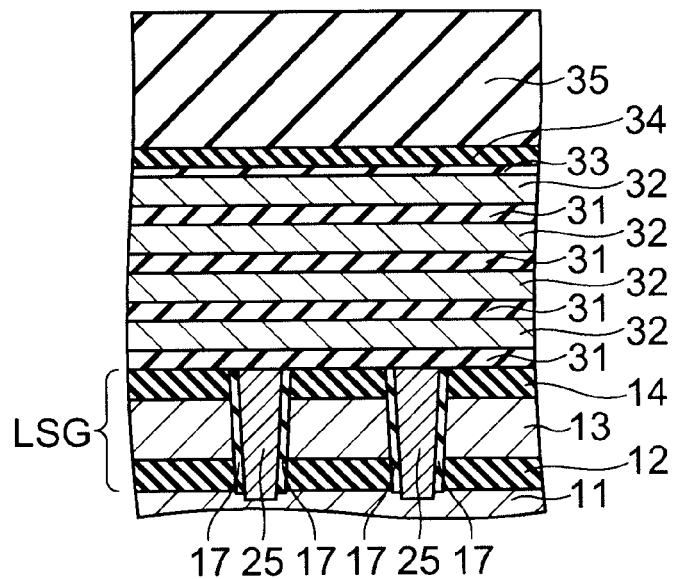
FIG. 14C is a process cross-sectional view taken along line B-B' shown in FIG. 14A.
Figure 15A:
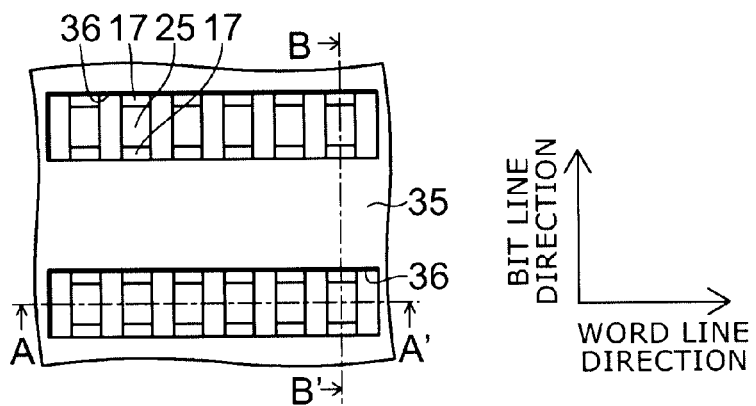
FIG. 15A is a process plan view illustrating the method for manufacturing the nonvolatile semiconductor memory device according to the first embodiment.
Figure 15B:
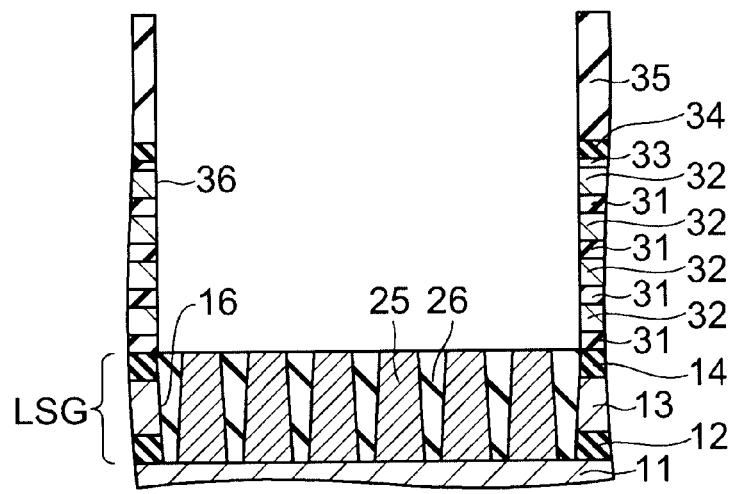
FIG. 15B is a process cross-sectional view taken along line A-A' shown in FIG. 15A.
Figure 15C:
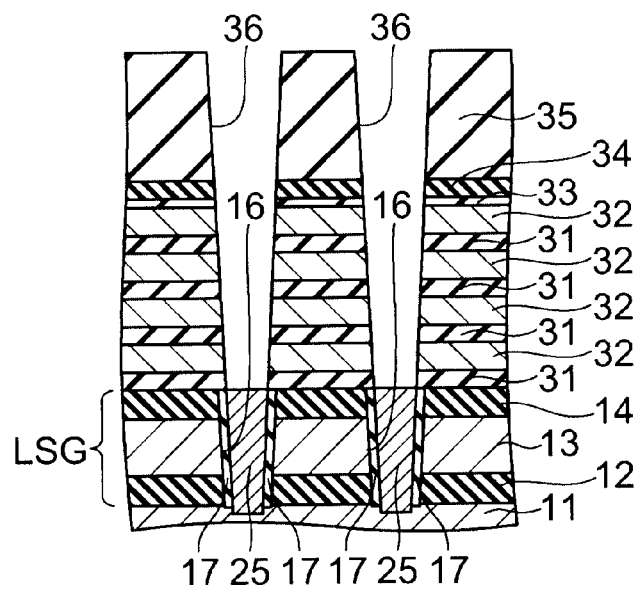
FIG. 15C is a process cross-sectional view taken along line B-B' shown in FIG. 15A.
Figure 16A:
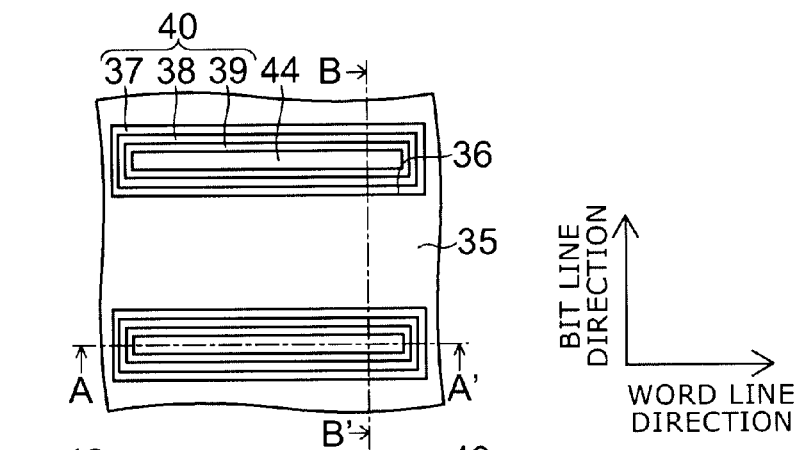
FIG. 16A is a process plan view illustrating the method for manufacturing the nonvolatile semiconductor memory device according to the first embodiment.
Figure 16B:
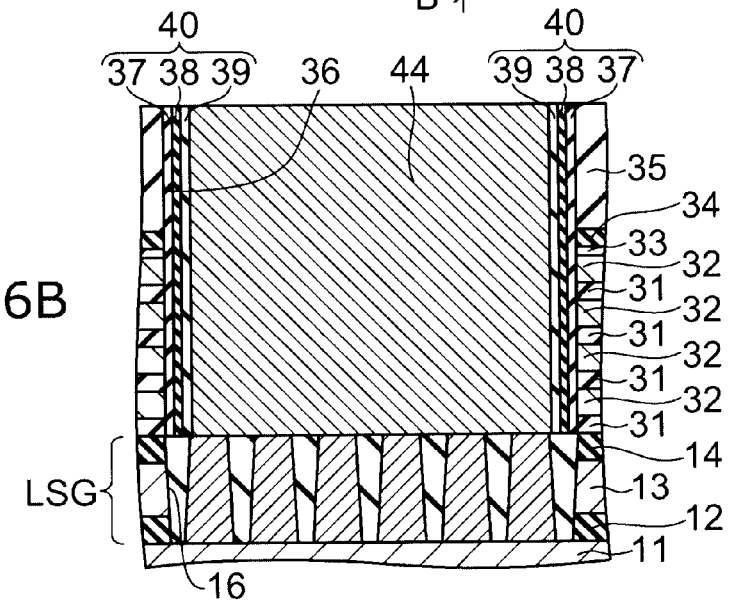
FIG. 16B is a process cross-sectional view taken along line A-A' shown in FIG. 16A.
Figure 16C:
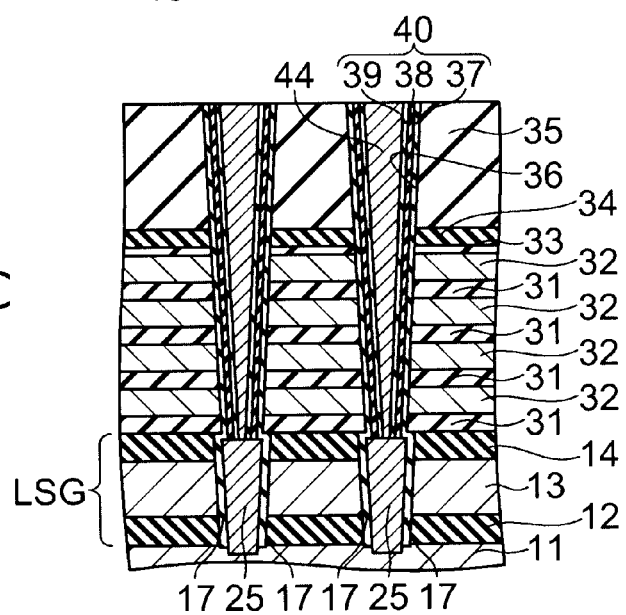
FIG. 16C is a process cross-sectional view taken along line B-B' shown in FIG. 16A.

FIGS. 14A to 16C are process views illustrating the method for manufacturing the nonvolatile semiconductor memory device according to this embodiment, where FIGS. 14A, 15A, and 16A are plan views, FIGS. 14B, 15B, and 16B are cross-sectional views taken along line A-A' shown in FIGS. 14A, 15A, and 16A, respectively, and FIGS. 14C, 15C, and 16C are cross-sectional views taken along line B-B' shown in FIGS. 14A, 15A, and 16A, respectively.

Figure 17A:
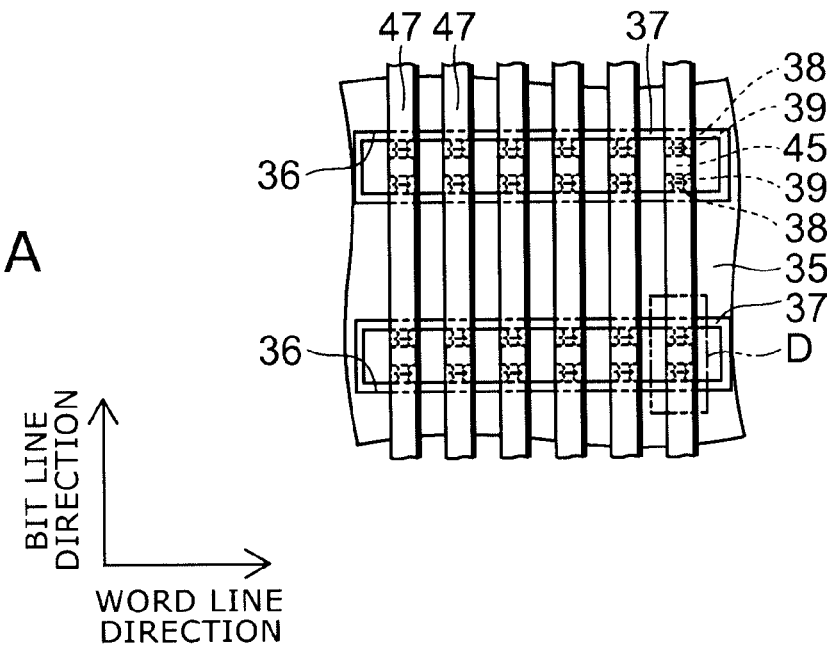
FIGS. 17A and 17B are process views illustrating the method for manufacturing the nonvolatile semiconductor memory device according to the first embodiment, where
Figure 17B:
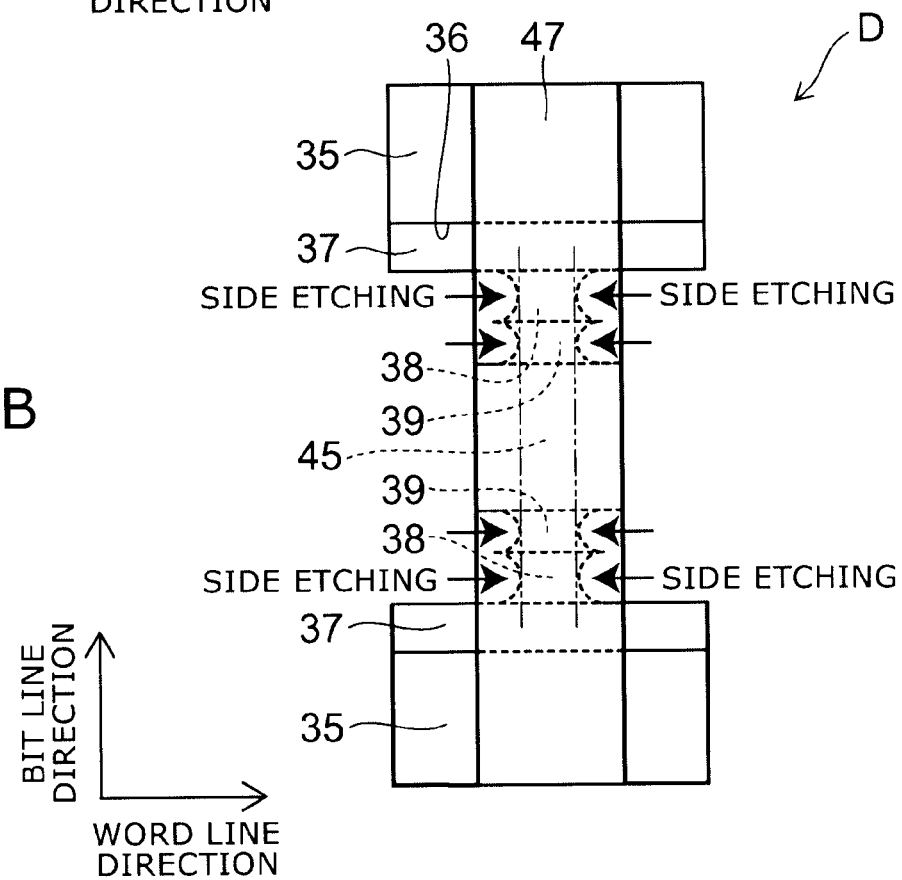

FIGS. 17A and 17B are process views illustrating the method for manufacturing the nonvolatile semiconductor memory device according to this embodiment, where FIG. 17A is a plan view, and FIG. 17B is an enlarged view of portion D shown in FIG. 17A.

Figure 18:
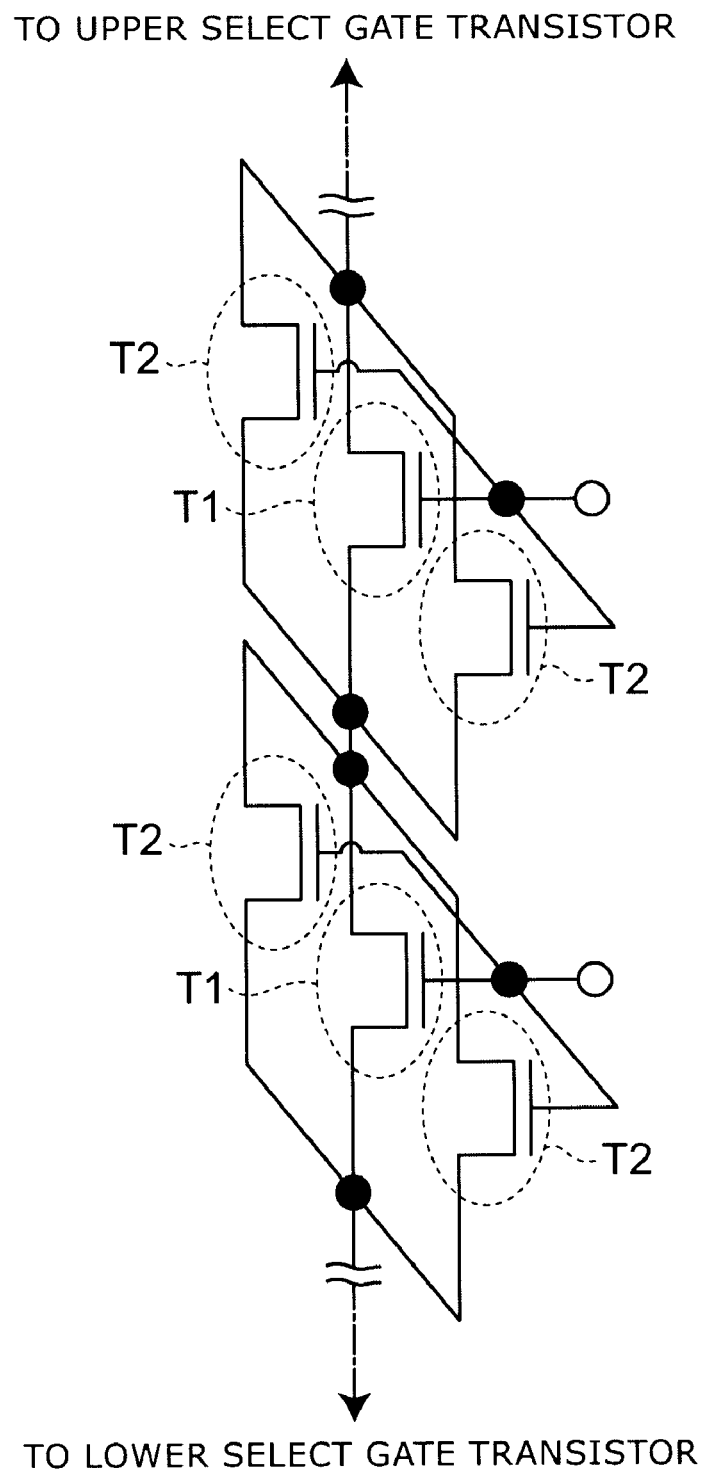
FIG. 18 is a schematic circuit diagram illustrating the nonvolatile semiconductor memory device as shown in FIGS. 17A and 17B.

FIG. 18 is a schematic circuit diagram illustrating the nonvolatile semiconductor memory device as shown in FIGS. 17A and 17B.

Figure 19:
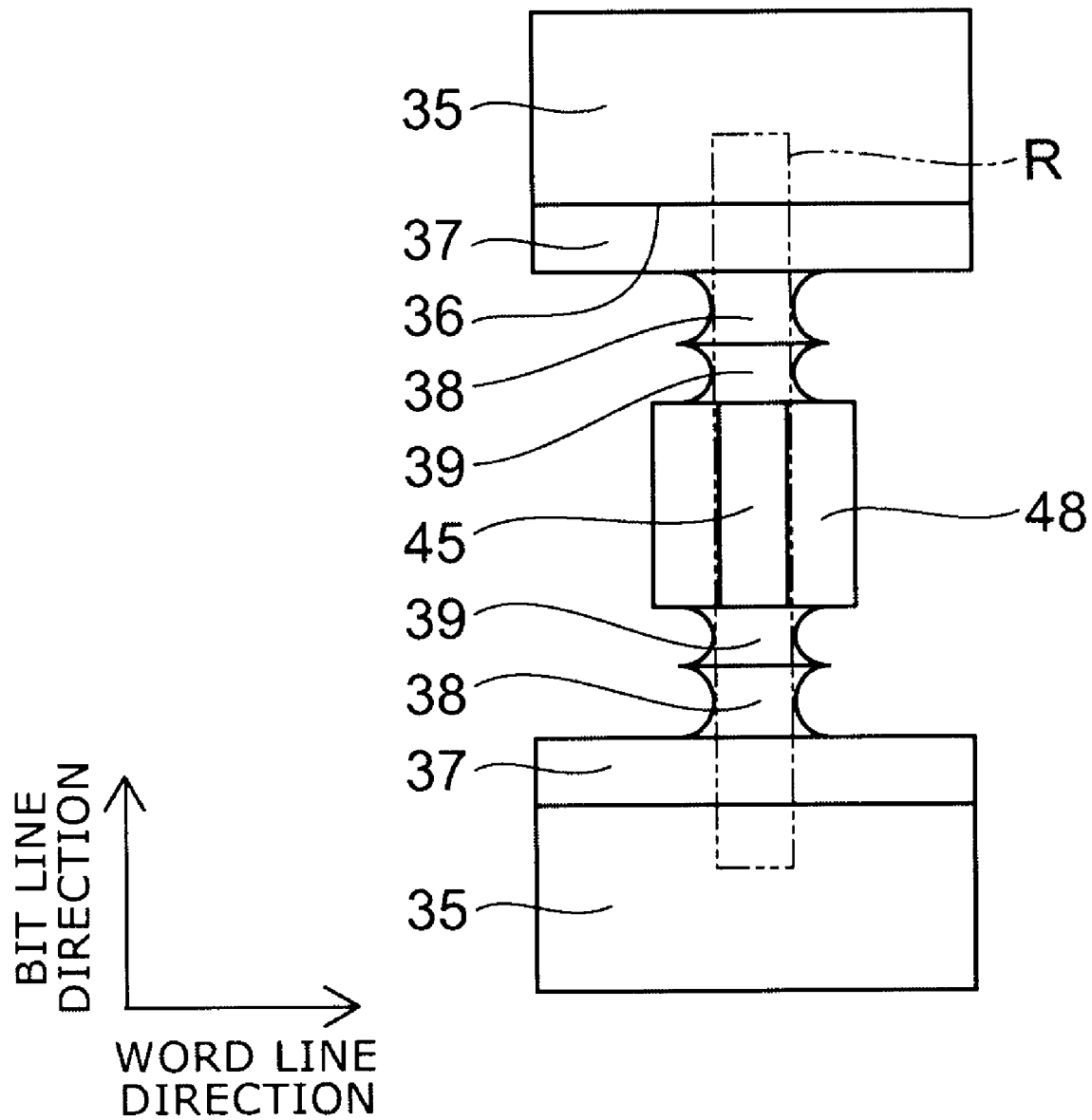
FIG. 19 is a process plan view illustrating the method for manufacturing the nonvolatile semiconductor memory device according to the first embodiment.

FIG. 19 is a process plan view illustrating the method for manufacturing the nonvolatile semiconductor memory device according to this embodiment, showing the same region as FIG. 17B.

FIGS. 20A to 26C are process views illustrating the method for manufacturing the nonvolatile semiconductor memory device according to this embodiment, where FIGS. 20A, 21A, 22A, 23A, 24A, 25A, and 26A are plan views, FIGS. 20B, 21B, 22B, 23B, 24B, 25B, and 26B are cross-sectional views taken along line A-A' shown in FIGS. 20A, 21A, 22A, 23A, 24A, 25A, and 26A, respectively, and FIGS. 20C, 21C, 22C, 23C, 24C, 25C, and 26C are cross-sectional views taken along line B-B' shown in FIGS. 20A, 21A, 22A, 23A, 24A, 25A, and 26A, respectively.

The method for manufacturing a nonvolatile semiconductor memory device according to this embodiment is broadly divided into the following three processes:

(1) Fabricating a lower select gate transistor section by arranging a plurality of lower select gate transistors on a silicon substrate in a two-dimensional matrix configuration;

(2) Fabricating a memory cell section by arranging a plurality of memory cells on the lower select gate transistor section in a three-dimensional matrix configuration; and (3) Fabricating an upper select gate transistor section by arranging a plurality of upper select gate transistors on the memory cell section in a two-dimensional matrix configuration.

First, the method for fabricating a lower select gate transistor section is described.

Figure 1A:
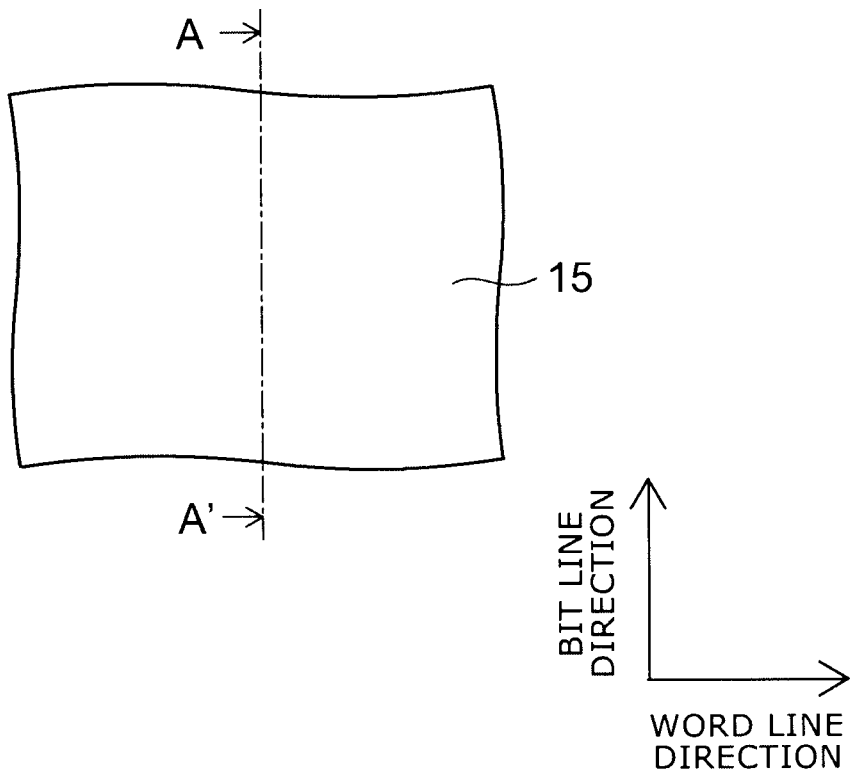
FIG. 1A is a process plan view illustrating a method for manufacturing a nonvolatile semiconductor memory device according to a first embodiment of the invention.
Figure 1B:
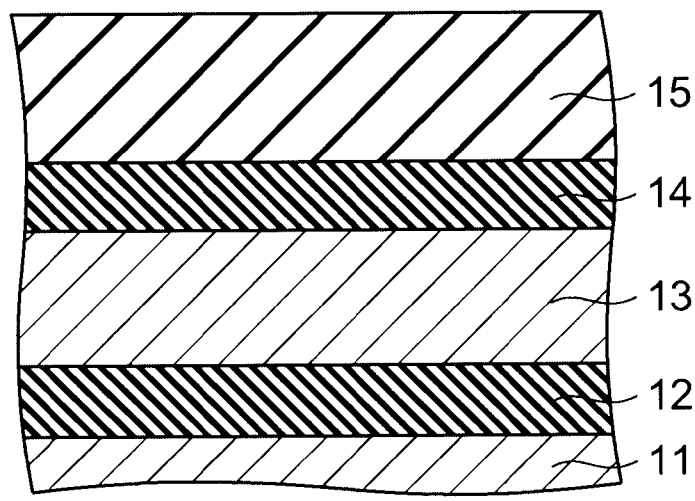
FIG. 1B is a process cross-sectional view taken along line A-A' shown in FIG. 1A.

As shown in FIGS. 1A and 1B, a silicon substrate 11 is prepared, and silicon oxide is deposited on this silicon substrate 11 illustratively by using TEOS (tetraethoxysilane, or tetraethyl orthosilicate, $Si(OC_2H_5)_4$) to form an interlayer dielectric film 12. Next, polysilicon is deposited to form a lower gate electrode film 13. Then, an interlayer dielectric film 14 illustratively made of silicon nitride is formed. Subsequently, a hard mask 15 illustratively made of BSG (boron silicate glass, or boron-doped silicon glass) is formed.

Figure 2A:
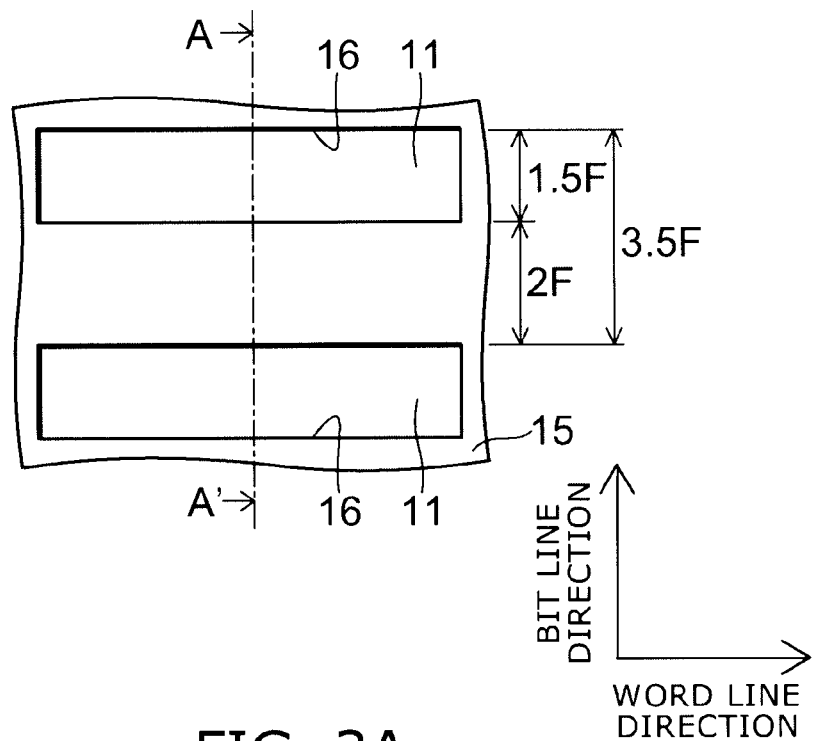
FIG. 2A is a process plan view illustrating the method for manufacturing the nonvolatile semiconductor memory device according to the first embodiment.
Figure 2B:
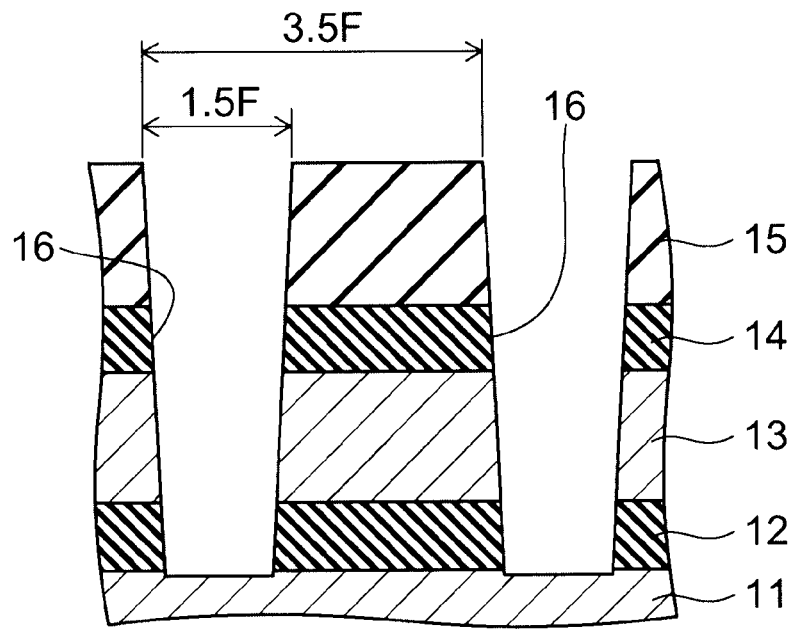
FIG. 2B is a process cross-sectional view taken along line A-A' shown in FIG. 2A.

Next, as shown in FIGS. 2A and 2B, the hard mask 15, the interlayer dielectric film 14, the lower gate electrode film 13, and the interlayer dielectric film 12 are processed by lithography. Thus, a plurality of trenches 16 arranged in the bit line direction and extending in the word line direction are formed. It is noted that the stacking direction of the aforementioned films, the word line direction, and the bit line direction are orthogonal to each other. Here, the width of the trench 16 is 1.5 F, and the arrangement pitch of the trenches 16 is 3.5 F, where F is the minimum processing dimension of lithography. Hence, the distance between the trenches 16 is 2 F. The trench 16 is shaped like a taper narrowing downward. The silicon substrate 11 is exposed to the bottom of the trench 16.

Figure 3A:
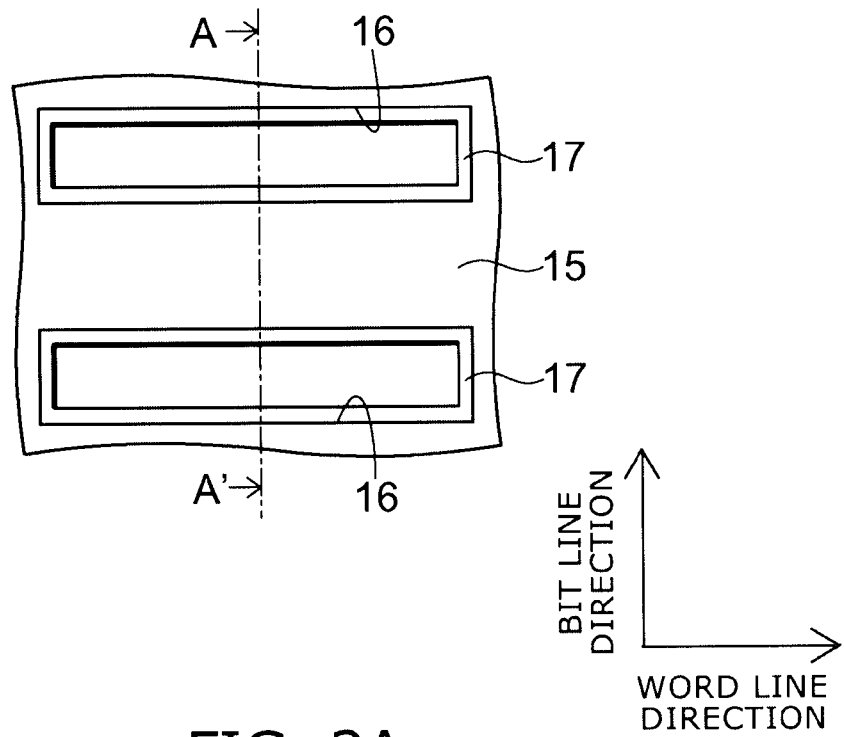
FIG. 3A is a process plan view illustrating the method for manufacturing the nonvolatile semiconductor memory device according to the first embodiment.
Figure 3B:
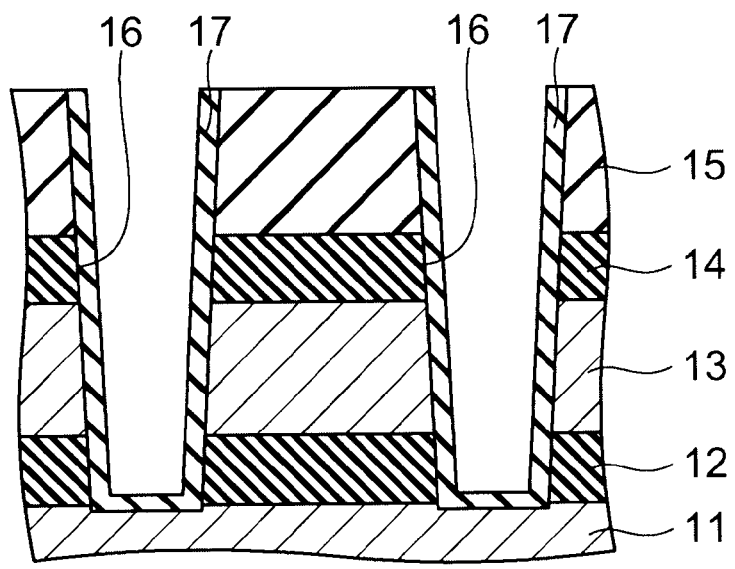
FIG. 3B is a process cross-sectional view taken along line A-A' shown in FIG. 3A.

Next, as shown in FIGS. 3A and 3B, a gate dielectric film 17 illustratively made of silicon nitride and having a thickness of e.g. 20 nm is formed on the inner surface of the trench 16.

Figure 4A:
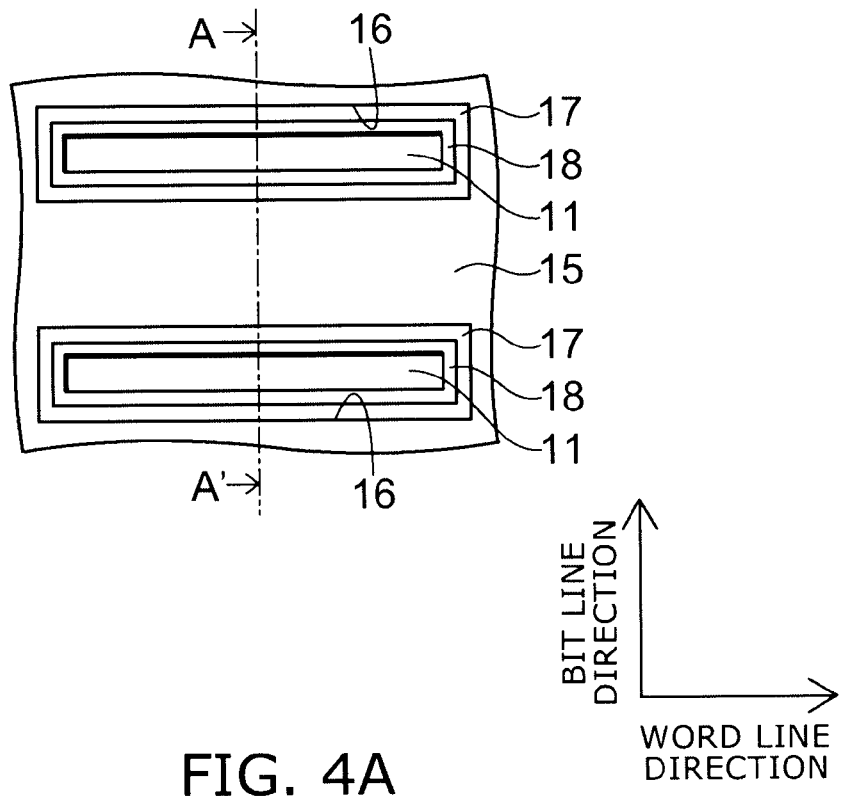
FIG. 4A is a process plan view illustrating the method for manufacturing the nonvolatile semiconductor memory device according to the first embodiment.
Figure 4B:
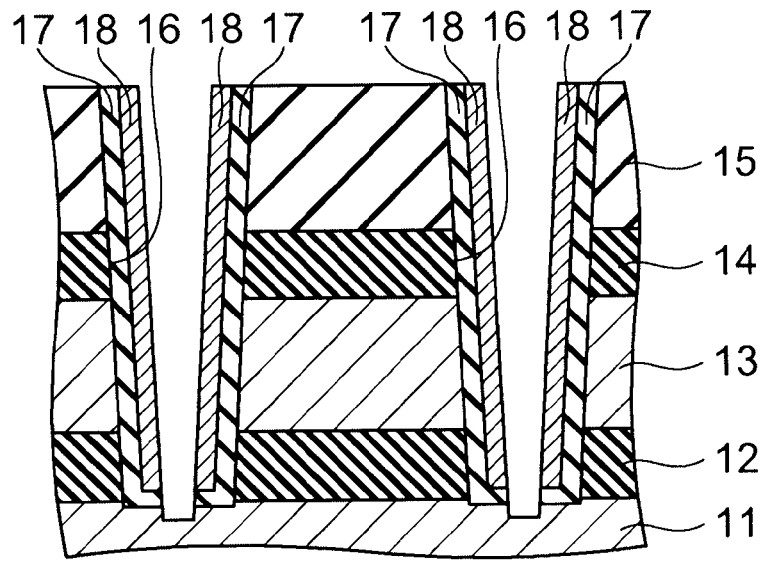
FIG. 4B is a process cross-sectional view taken along line A-A' shown in FIG. 4A.

Next, as shown in FIGS. 4A and 4B, a spacer film 18 illustratively made of amorphous silicon is formed on the gate dielectric film 17. Next, RIE (reactive ion etching) and dilute hydrofluoric acid treatment are performed to remove the spacer film 18, the gate dielectric film 17, and natural oxide film and the like from the bottom of the trench 16 to expose the silicon substrate 11. Here, the spacer film 18 functions as a protective film for protecting the gate dielectric film 17 from dilute hydrofluoric acid.

Figure 5A:
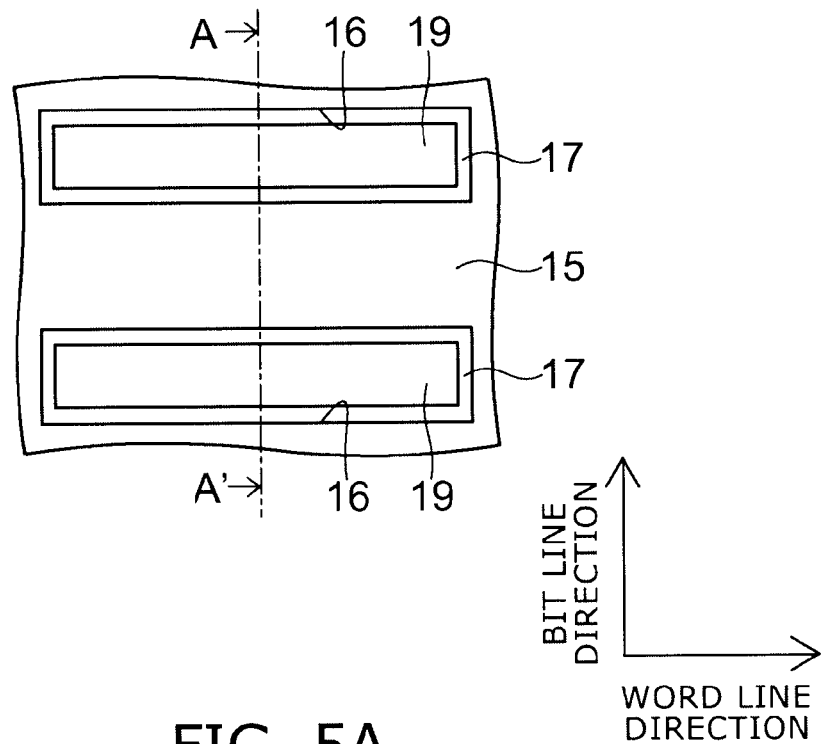
FIG. 5A is a process plan view illustrating the method for manufacturing the nonvolatile semiconductor memory device according to the first embodiment.
Figure 5B:
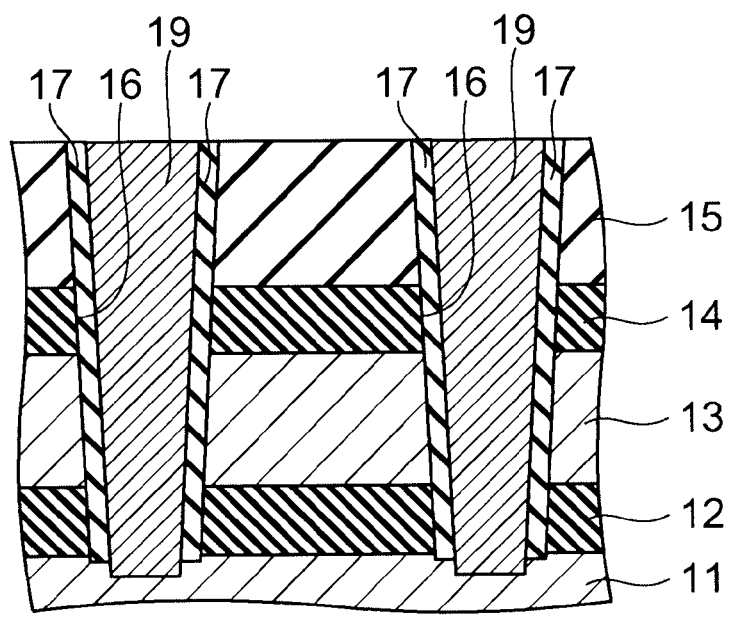
FIG. 5B is a process cross-sectional view taken along line A-A' shown in FIG. 5A.

Next, as shown in FIGS. 5A and 5B, the spacer film 18 (see FIGS. 4A and 4B) is removed from inside the trench 16, which is then refilled with silicon so that a silicon body 19 is formed as a semiconductor member in the trench 16.

Next, as shown in FIG. 6, a silicon nitride film 21 is formed as a mask film entirely on the hard mask 15 (see FIGS. 5A and 5B). Next, a resist film 22 is formed on the silicon nitride film 21. The resist film 22 has a line-and-space pattern extending in the bit line direction, that is, in the direction orthogonal to the extending direction (word line direction) of the trenches 16, and having a width of 1 F and an arrangement pitch of 2 F.

Next, as shown in FIG. 7, the resist film 22 is slimmed by isotropic etching such as CDE (chemical dry etching) to reduce its width to 0.5 F. Here, the distance between the adjacent resist films 22 becomes 1.5 F. Then, this resist film 22 is used as a mask to perform RIE to process the silicon nitride film 21. Thus, the silicon nitride film 21 is processed into a line-and-space pattern extending in the bit line direction, where the width of the line portion is 0.5 F and the arrangement pitch is 2 F. Subsequently, the resist film 22 is removed.

Next, as shown in FIGS. 8A and 8B, a silicon oxide film, for example, is formed on the entire surface so as to cover the patterned silicon nitride film 21. Next, this silicon oxide film is etched back to be left only on both side surfaces of the silicon nitride film 21 so that a sidewall 23 made of silicon oxide is formed on both side surfaces of the silicon nitride film 21. The thickness of the silicon oxide film formed is such that the width of this sidewall 23 is 0.5 F.

Next, as shown in FIGS. 9A and 9B, the silicon nitride film 21 as a mask film is removed illustratively by using hot phosphoric acid. Thus, only the sidewall 23 is left on the hard mask 15. Consequently, the sidewall 23 realizes a line-and-space pattern, where the arrangement pitch is 1 F and the line and the space each have a width of 0.5 F.

Next, as shown in FIGS. 10A and 10B, the sidewall 23 is used as a mask to perform RIE and wet etching to selectively remove the silicon body 19 and the gate dielectric film 17. Thus, the silicon body 19 and the gate dielectric film 17 are processed into a line-and-space pattern having an arrangement pitch of 1 F and each having a width of 0.5 F. The processing process shown in FIGS. 6 to 10B is referred to as "sidewall transfer process". At this time, the hard mask 15 is also removed to some extent. However, because the hard mask 15 is thick enough to remain to the end, and the lower gate electrode film 13 and the like therebelow are not processed. Thus, the silicon body 19 is divided in each trench 16 into a plurality of silicon pillars 25 arranged in a row in the word line direction. Each silicon pillar 25 is shaped like a tapered, generally quadrangular prism, which widens downward in the word line direction, narrows downward in the bit line direction, and is shaped like a rectangle as viewed from above. Furthermore, in the bit line direction as viewed from each silicon pillar 25, that is, between each silicon pillar 25 and the lower gate electrode film 13 and the like, the gate dielectric film 17 is left behind.

Next, as shown in FIGS. 11A to 11D, the sidewall 23 (see FIGS. 10A and 10B) is removed.

Next, as shown in FIGS. 12A to 12D, the silicon pillar 25 and the gate dielectric film 17 are recessed by a combination of, for example, RIE and wet etching, to lower the upper surface of the silicon pillar 25 and the gate dielectric film 17 to the position of the lower surface of the hard mask 15.

Next, as shown in FIGS. 13A to 13D, the hard mask 15 is removed. Then, TEOS or the like is used to bury silicon oxide 26 in the space between the silicon pillars 25 in the trench 16.

Thus, a vertical transistor is formed at the intersection between each silicon pillar 25 and each lower gate electrode film 13 and serves as a lower select gate transistor. Thus, the lower select gate transistors are arranged in a two-dimensional matrix configuration, and as a whole, a lower select gate transistor section LSG is fabricated.

Next, a memory cell section is formed above the lower select gate transistor section LSG. The method for fabricating the memory cell section is described below.

As shown in FIGS. 14A to 14C, dielectric films 31 illustratively made of silicon oxide and electrode films 32 illustratively made of polysilicon are alternately stacked to form a multilayer body. For example, the dielectric film 31 and the electrode film 32 are each formed in four layers. Subsequently, a silicon oxide film 33 is formed, and a silicon nitride film 34 is formed. Next, a hard mask 35 illustratively made of silicon nitride or BSG is formed. The electrode film 32 is a conductive film to be processed in the subsequent process and serve as a word line of the nonvolatile semiconductor memory device according to this embodiment.

The fabrication method subsequent thereto has a lot in common with the aforementioned method for fabricating the lower select gate transistor section, and hence the common features are described briefly.

As shown in FIGS. 15A to 15C, the hard mask 35, the silicon nitride film 34, the silicon oxide film 33, the plurality of electrode films 32, and the plurality of interlayer dielectric films 31 are selectively etched away to form trenches 36 extending in the word line direction. The trench 36 is shaped like a taper narrowing downward. The trench 36 is formed immediately above the trench 16.

Next, as shown in FIGS. 16A to 16C, on the inner surface of the trench 36, a silicon oxide film is deposited as a block film 37 to a thickness of e.g. 5 nm, a silicon nitride film is deposited as a charge storage film 38 to a thickness of e.g. 5 nm, and a silicon oxide film is deposited as a tunnel film 39 to a thickness of e.g. 3.5 nm. The block film 37, the charge storage film 38, and the tunnel film 39 constitute a memory film 40. The block film 37 is a film which substantially blocks the flow of current despite application of voltage within the operating voltage range of the device 1. The charge storage film 38 is a film which can retain charge, such as a film including electron trap sites. The tunnel film 39 is a film which is normally insulative, but passes a tunneling current upon application of a prescribed voltage within the operating voltage range of the device 1. Subsequently, a silicon body 44 is buried as a semiconductor member in the trench 36.

Next, the charge storage film 38, the tunnel film 39, and the silicon body 44 in the trench 36 are divided along the word line direction by the aforementioned sidewall transfer process. The method for this division is described below.

First, a mask film (not shown) made of silicon oxide is formed, and a line-and-space resist pattern (not shown) is formed, extending in the bit line direction and having a line width of 1 F and an arrangement pitch of 2 F. The line width of this resist pattern is reduced illustratively by CDE. Here, in expectation of the side etching amount described later, the line width of the resist pattern is made thinner than 0.5 F. Next, this resist pattern is used as a mask to etch the mask film to form a line-and-space mask pattern (not shown) extending in the bit line direction and having a line width of less than 0.5 F and an arrangement pitch of 2 F.

Subsequently, the resist pattern is removed. A sidewall 47 (see FIG. 17A) having a thickness of 0.5 F plus a side etching amount is formed on the side surface of the etched mask film, and the mask film is removed. Thus, a line-and-space pattern is formed from the sidewall 47, extending in the bit line direction and having a line width thicker than 0.5 F and an arrangement pitch of 1 F.

Next, as shown in FIG. 17A, the sidewall 47 is used as a mask to perform RIE. The condition for this RIE is such that the etching rate for polysilicon is sufficiently higher than the etching rate for silicon oxide and silicon nitride. This makes it possible to selectively remove only the silicon body 44 without substantially removing the memory film 40 in the trench 36. Consequently, the silicon body 44 is divided in the word line direction into silicon pillars 45 formed immediately below the sidewall 47.

Next, wet etching with dilute hydrofluoric acid is performed with the sidewall 47 left behind. This removes the tunnel film 39 made of silicon oxide in the opening between the sidewalls 47 (hereinafter referred to as "mask opening"). Next, wet etching with hot phosphoric acid is performed with the sidewall 47 left behind. This removes the charge storage film 38 made of silicon nitride in the mask opening.

At this time, as shown in FIG. 17B, due to isotropy of wet etching, immediately below the sidewall 47, the tunnel film 39 and the charge storage film 38 are side-etched from both lateral sides. For example, in the case where the charge storage film 38 has a thickness of 5 nm, sufficient removal of the charge storage film 38 in the mask opening results in side etching of 5 nm or more on each side immediately below the sidewall 47, thereby shortening the length of the charge storage film 38 in the word line direction. On the other hand, the silicon pillar 45 made of polysilicon is hardly affected by the aforementioned wet etching, and hence is left also between the portions of the charge storage film 38 removed by side etching.

Consequently, as shown in FIG. 18, in one memory cell, a memory transistor T1 having a charge storage film and being capable of shifting its threshold voltage by charge programming, and a fixed threshold transistor T2 having no charge storage film and being incapable of shifting its threshold voltage by charge programming are formed, and connected in parallel to each other. In this case, even if "0" is written to this memory cell, the threshold voltage of the fixed threshold transistor T2 does not change although the threshold voltage of the memory transistor T1 changes. Hence, a read operation on this memory cell may result in turning on the fixed threshold transistor T2 earlier, and the programmed value is determined as "1", causing misreading.

Thus, in this embodiment, to avoid this, after the silicon pillars 45 are formed by selectively removing the silicon body 44 by RIE, oxidation is performed as shown in FIG. 19. This oxidizes both side portions of the silicon pillar 45 in the word line direction from the mask opening side to a depth corresponding to the aforementioned side etching of the charge storage film 38 to form an oxidized portion 48. Subsequently, the sidewall 47 is removed. Thus, in the word line direction, the width of the silicon pillar 45 is thinned by the amount of the oxidized portion 48 and becomes generally equal to the width of the charge storage film 38. Consequently, the memory cell is formed in region R shown in FIG. 19, and the fixed threshold transistor T2 shown in FIG. 18 is not formed. Thus, the aforementioned misreading can be avoided.

Here, instead of oxidizing both side portions of the silicon pillar 45 as described above, both side portions of the silicon pillar 45 may be removed (recessed) by CDE. In this case, the condition for CDE is such that the etching rate for silicon is higher than the etching rate for silicon oxide and silicon nitride and allows only silicon to be removed with high selection ration. Thus, the width of the silicon pillar 45 remaining in the memory cell is made equal to the width of the charge storage film 38.

Figure 20A:
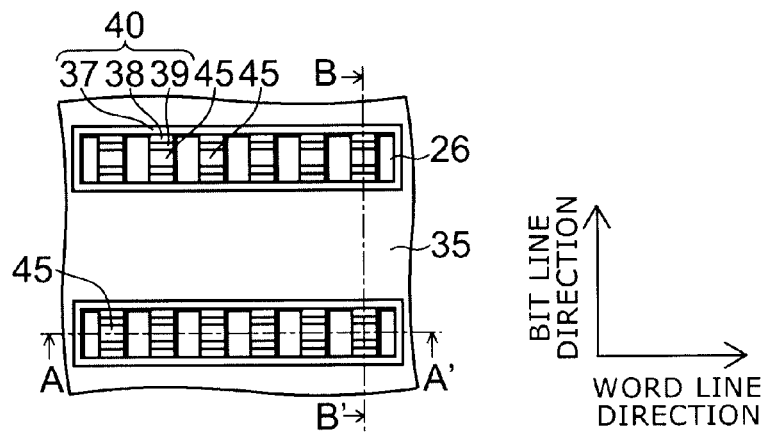
FIG. 20A is a process plan view illustrating the method for manufacturing the nonvolatile semiconductor memory device according to the first embodiment.
Figure 20B:
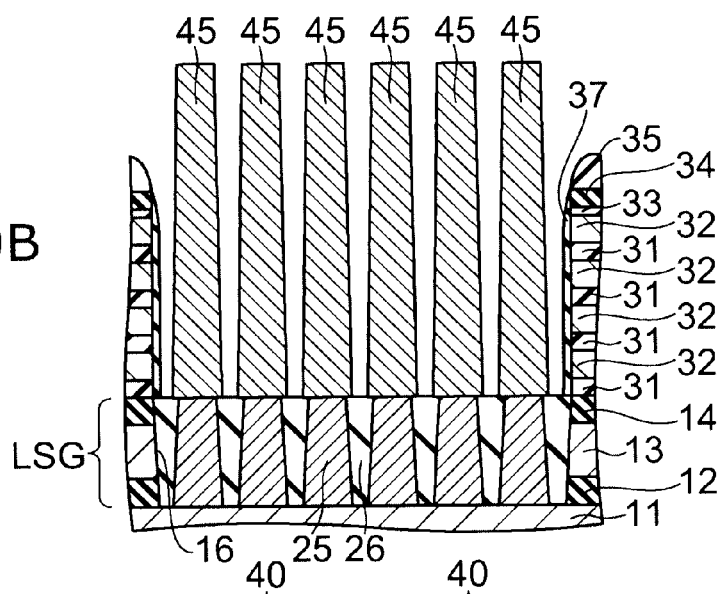
FIG. 20B is a process cross-sectional view taken along line A-A' shown in FIG. 20A.
Figure 20C:
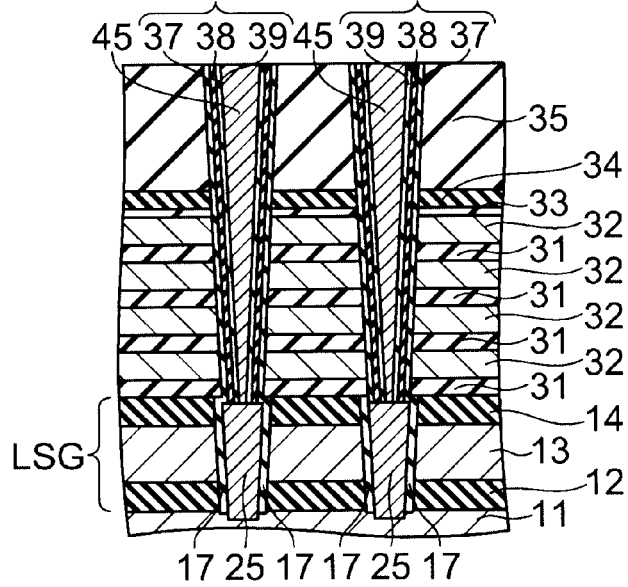
FIG. 20C is a process cross-sectional view taken along line B-B' shown in FIG. 20A.

By the foregoing method, as shown in FIGS. 20A to 20C, the silicon body 44 in the trench 36 can be divided in the word line direction into silicon pillars 45, and simultaneously the charge storage film 38 and the tunnel film 39 can be divided in the word line direction. As described above, although the sidewall 47 is formed with a width thicker than 0.5 F, the width of the charge storage film 38, the tunnel film 39, and the silicon pillar 45 is decreased to 0.5 F by side etching of the charge storage film 38 and the tunnel film 39 shown in FIG. 17B and side surface oxidation of the silicon pillar 45 shown in FIG. 19. Consequently, in the word line direction, a periodic structure with a line width of 0.5 F and a space width of 0.5 F can be realized. Furthermore, the silicon pillar 45 is located immediately above and coupled to the silicon pillar 25. As viewed from above, the silicon pillar 45 is shaped like a rectangle.

Figure 21A:
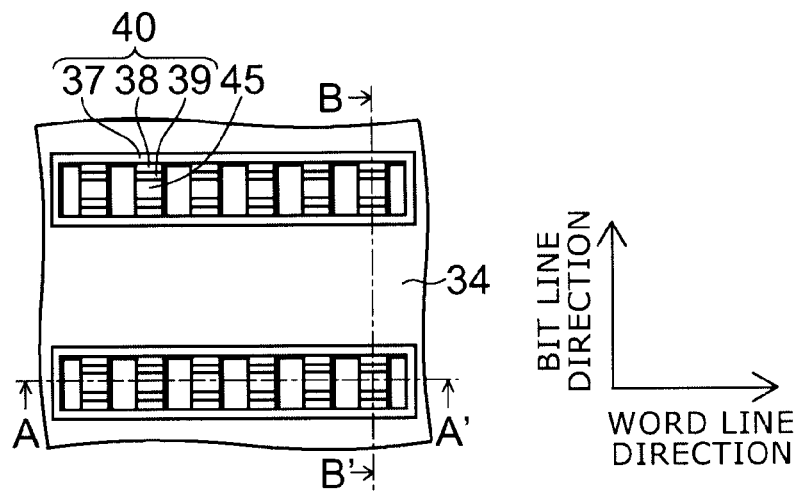
FIG. 21A is a process plan view illustrating the method for manufacturing the nonvolatile semiconductor memory device according to the first embodiment.
Figure 21B:
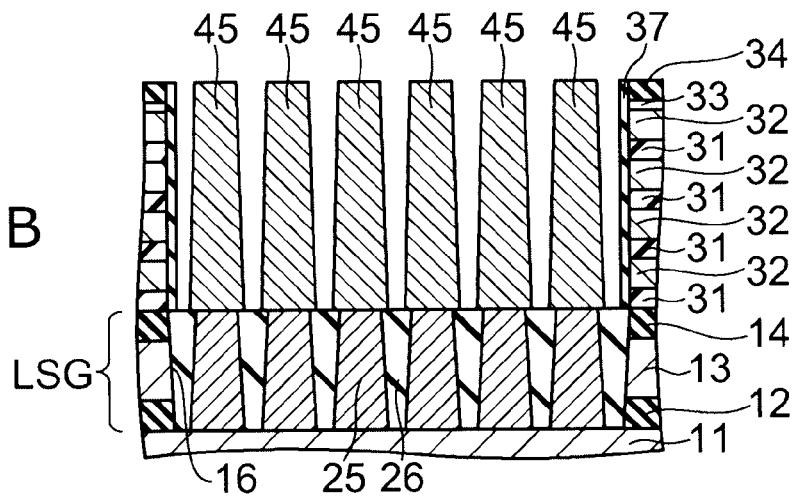
FIG. 21B is a process cross-sectional view taken along line A-A' shown in FIG. 21A.
Figure 21C:
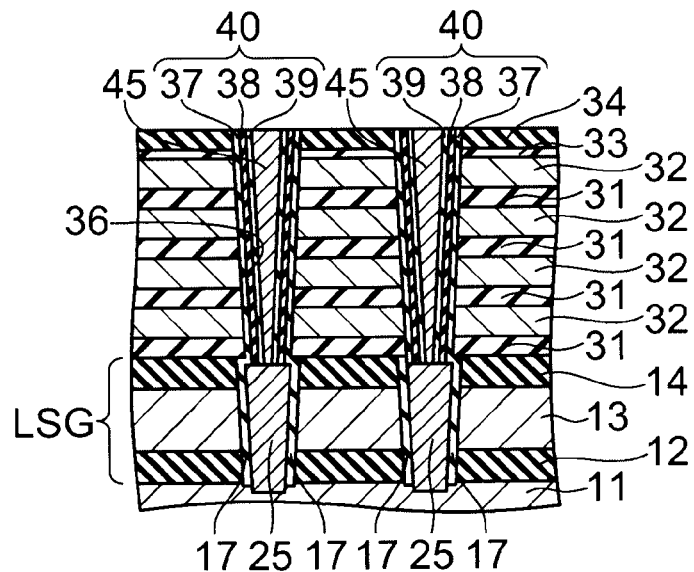
FIG. 21C is a process cross-sectional view taken along line B-B' shown in FIG. 21A.

Next, as shown in FIGS. 21A to 21C, the silicon pillar 45 and the memory film 40 are recessed by a combination of, for example, RIE and wet etching, to lower the upper surface of the silicon pillar 45 and the memory film 40 to the position of the lower surface of the hard mask 35 (see FIGS. 20A to 20C). Subsequently, the hard mask 35 is removed.

Figure 22A:
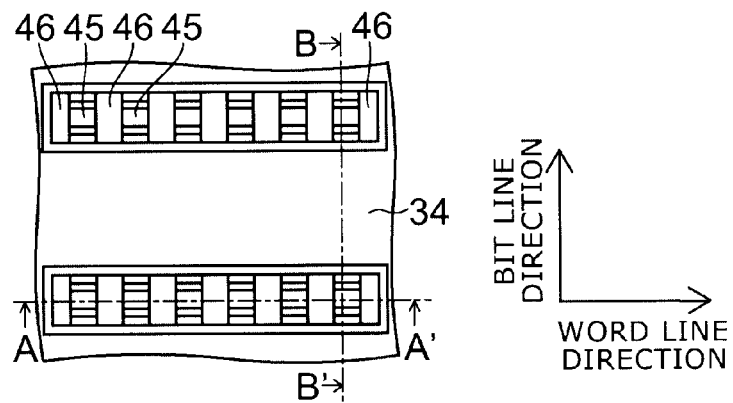
FIG. 22A is a process plan view illustrating the method for manufacturing the nonvolatile semiconductor memory device according to the first embodiment.
Figure 22B:
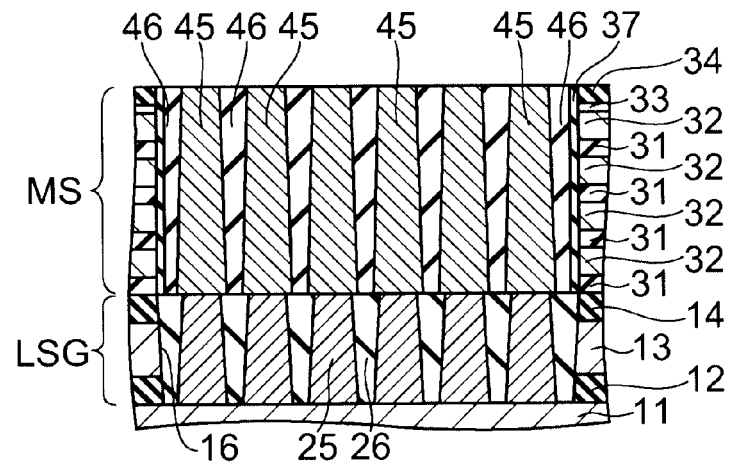
FIG. 22B is a process cross-sectional view taken along line A-A' shown in FIG. 22A.
Figure 22C:
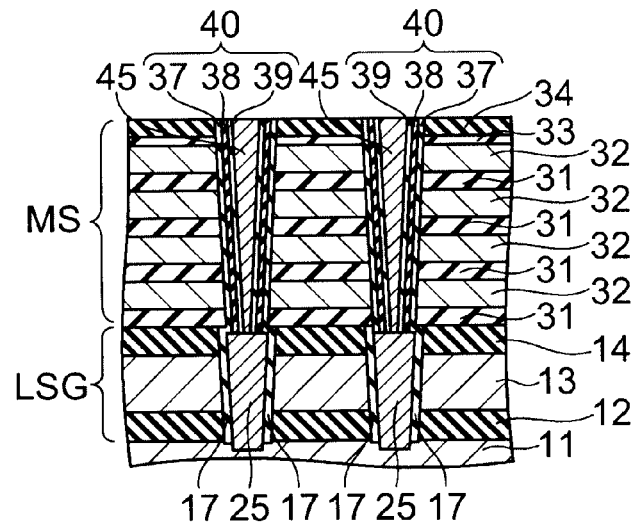
FIG. 22C is a process cross-sectional view taken along line B-B' shown in FIG. 22A.

Next, as shown in FIGS. 22A to 22C, silicon oxide 46 is buried between the silicon pillars 45. Thus, a vertical transistor is formed at the intersection between each silicon pillar 45 and each electrode film 32 and serves as a memory cell. Thus, the memory cells are arranged in a three-dimensional matrix configuration, and as a whole, a memory cell section MS is fabricated.

Next, by a method similar to the aforementioned method for fabricating the lower select gate transistor section LSG, an upper select gate transistor section USG is fabricated on the memory cell section MS.

Figure 23A:
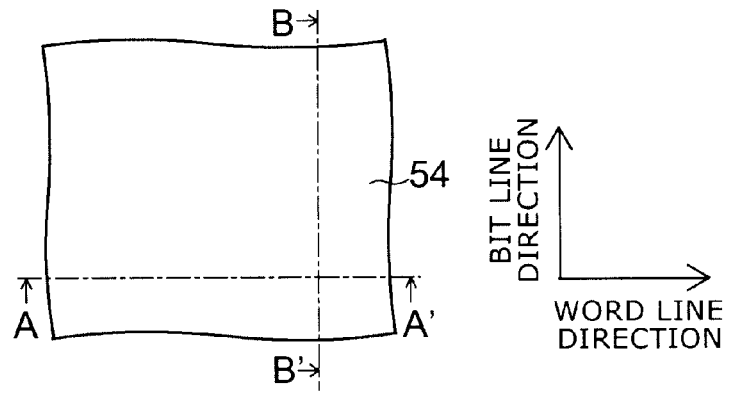
FIG. 23A is a process plan view illustrating the method for manufacturing the nonvolatile semiconductor memory device according to the first embodiment.
Figure 23B:
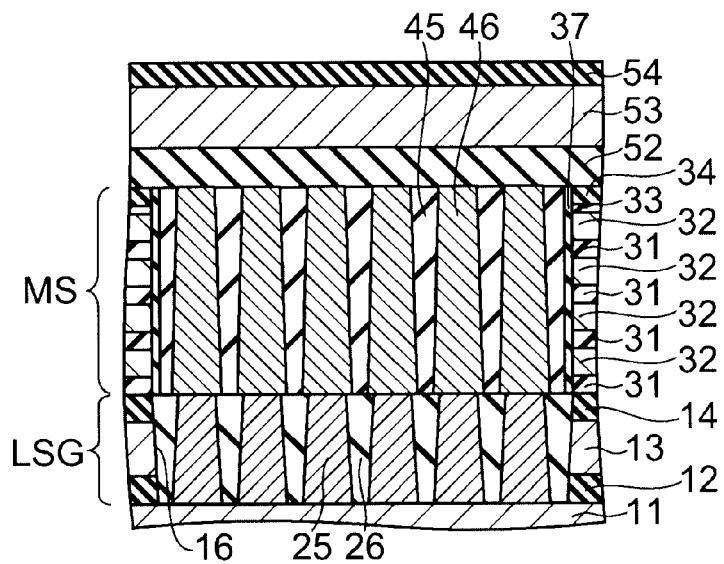
FIG. 23B is a process cross-sectional view taken along line A-A' shown in FIG. 23A.
Figure 23C:
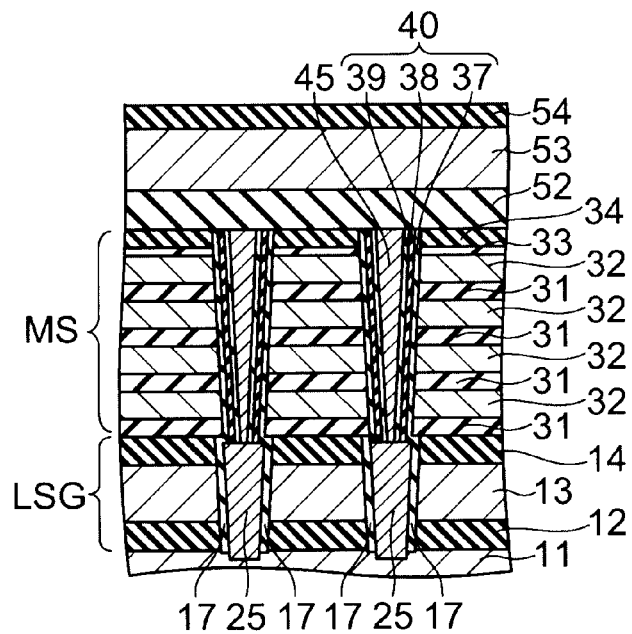
FIG. 23C is a process cross-sectional view taken along line B-B' shown in FIG. 23A.

More specifically, as shown in FIGS. 23A to 23C, an interlayer dielectric film 52 is formed illustratively using TEOS on the memory cell section MS, an upper gate electrode film 53 illustratively made of polysilicon is formed, and an interlayer dielectric film 54 illustratively made of silicon nitride is formed.

Figure 24A:
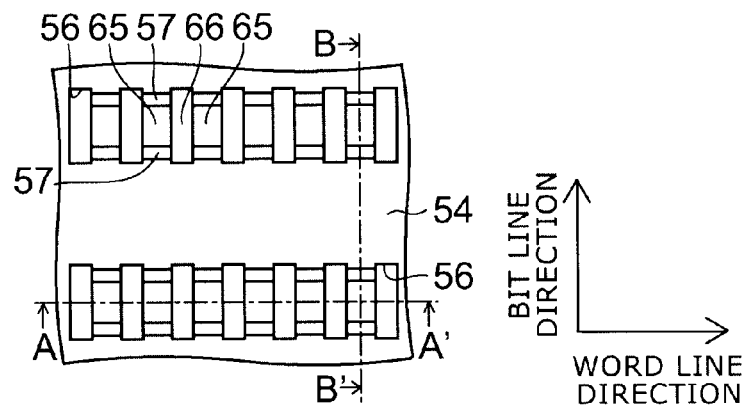
FIG. 24A is a process plan view illustrating the method for manufacturing the nonvolatile semiconductor memory device according to the first embodiment.
Figure 24B:
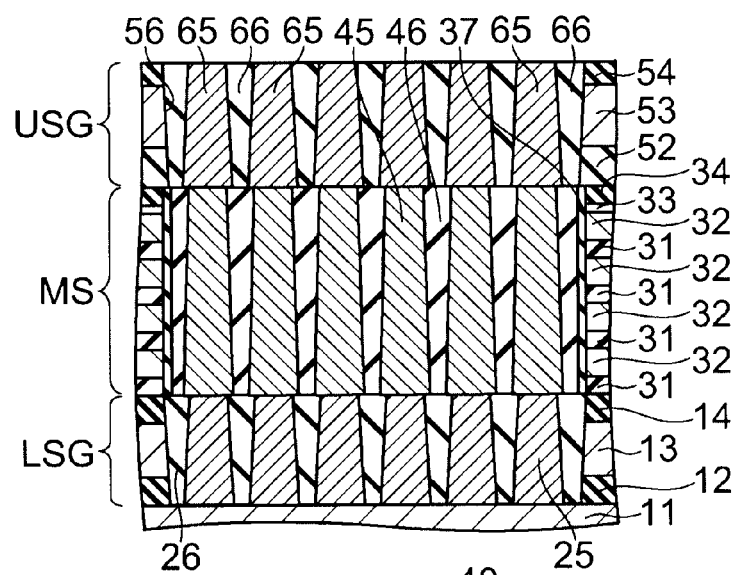
FIG. 24B is a process cross-sectional view taken along line A-A' shown in FIG. 24A.
Figure 24C:
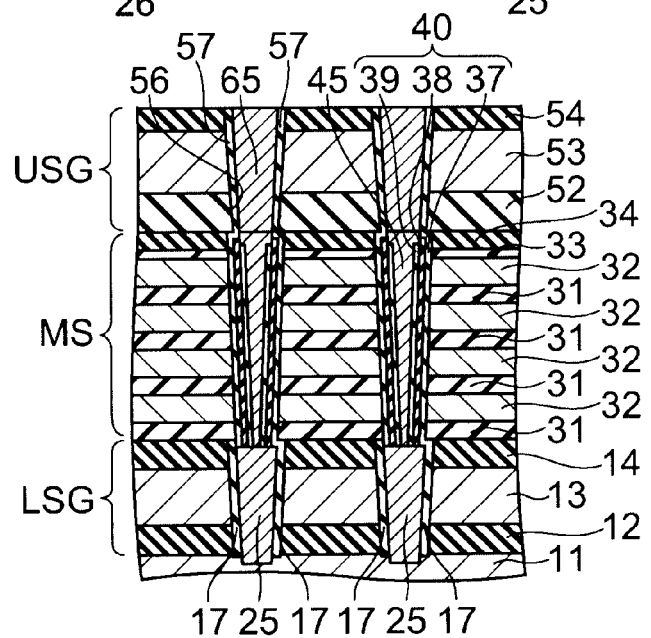
FIG. 24C is a process cross-sectional view taken along line B-B' shown in FIG. 24A.

Next, as shown in FIGS. 24A to 24C, a line-shaped trench 56 extending in the word line direction is formed immediately above the trench 36. Next, a gate dielectric film 57 and a spacer film (not shown) are formed on the inner surface of the trench 56, and the gate dielectric film 57 and the spacer film are removed from the bottom surface of the trench 56, where a silicon body is buried. Then, by the sidewall transfer process and RIE, the silicon body and the gate dielectric film 57 are divided in the word line direction into silicon pillars 65, and silicon oxide 66 is buried between the silicon pillars 65. Here, the silicon pillar 65 is formed immediately above and coupled to the silicon pillar 45. As viewed from above, the silicon pillar 65 is shaped like a rectangle.

Thus, an upper select gate transistor is formed at the intersection between each silicon pillar 65 and each upper gate electrode film 53, and as a whole, an upper select gate transistor section USG is fabricated. In fabricating the lower select gate transistor section LSG and the upper select gate transistor section USG, the silicon body and the like can be divided by RIE, and hence there is no need for wet etching as in fabricating the memory cell section MS described above, causing no problem with side etching. Hence, there is no need for the process of oxidizing both side portions of the silicon pillar.

Figure 25A:
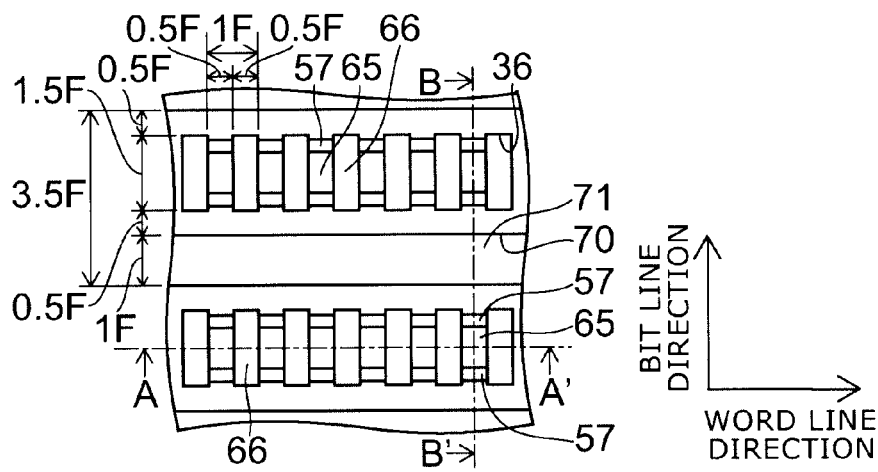
FIG. 25A is a process plan view illustrating the method for manufacturing the nonvolatile semiconductor memory device according to the first embodiment.
Figure 25B:
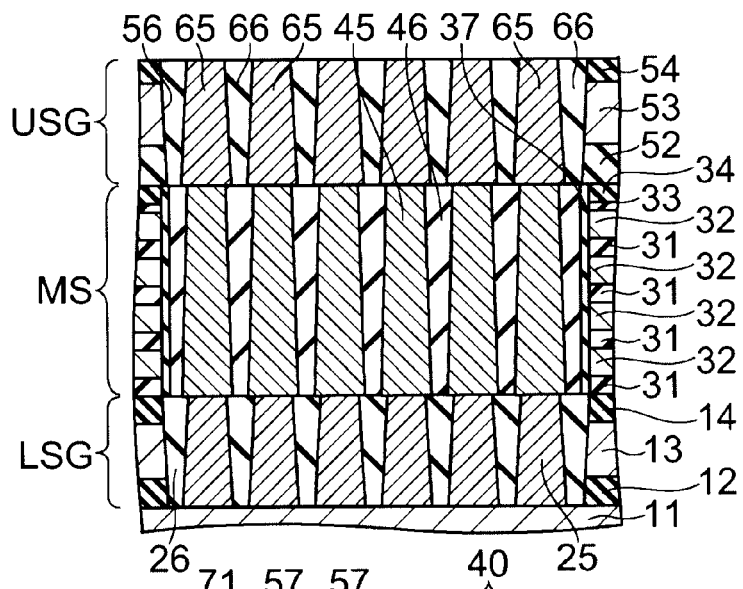
FIG. 25B is a process cross-sectional view taken along line A-A' shown in FIG. 25A.
Figure 25C:
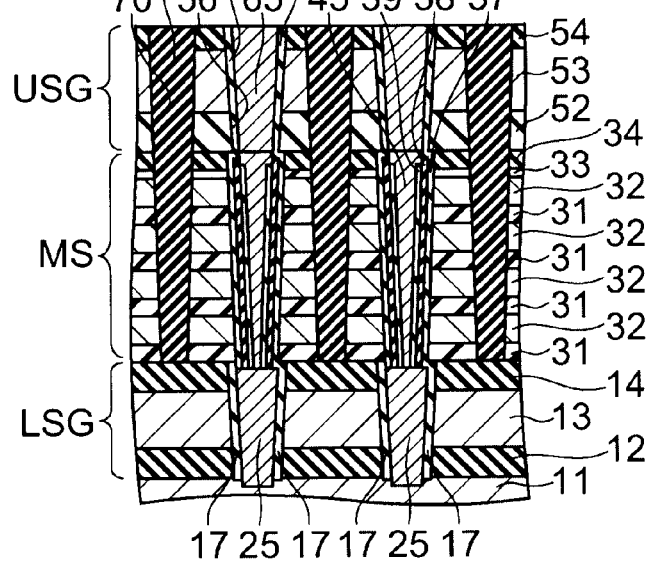
FIG. 25C is a process cross-sectional view taken along line B-B' shown in FIG. 25A.

Next, as shown in FIGS. 25A to 25C, in the region of the upper select gate transistor section USG and the memory cell section MS between the trenches 56, a trench 70 extending in the word line direction is formed. The trench 70 has a width of 1 F. That is, a trench 70 having a width of 1 F is formed in a strip-shaped region having a width of 2 F between the trenches 56. Next, silicon oxide 71, for example, is buried in the trench 70. Thus, the upper gate electrode film 53 of the upper select gate transistor section USG is divided in the bit line direction into line-shaped members extending in the word line direction. The upper gate electrode film 53 is provided for each row of silicon pillars arranged along the word line direction. The electrode film 32 of the memory cell section MS is also divided in the bit line direction into word lines extending in the word line direction. The electrode film 32 is also provided for each row of silicon pillars arranged along the word line direction. On the other hand, the lower gate electrode film 13 is not divided, but provided in common with a plurality of rows of silicon pillars arranged along the word line direction.

Figure 26A:
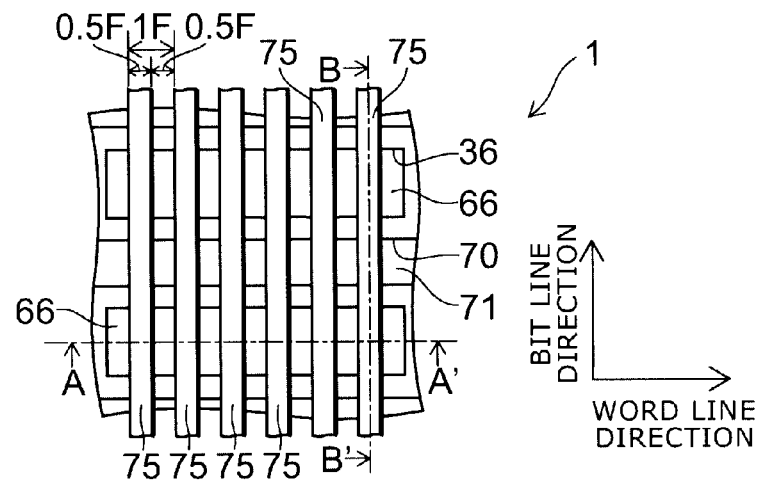
FIG. 26A is a process plan view illustrating the method for manufacturing the nonvolatile semiconductor memory device according to the first embodiment.
Figure 26B:
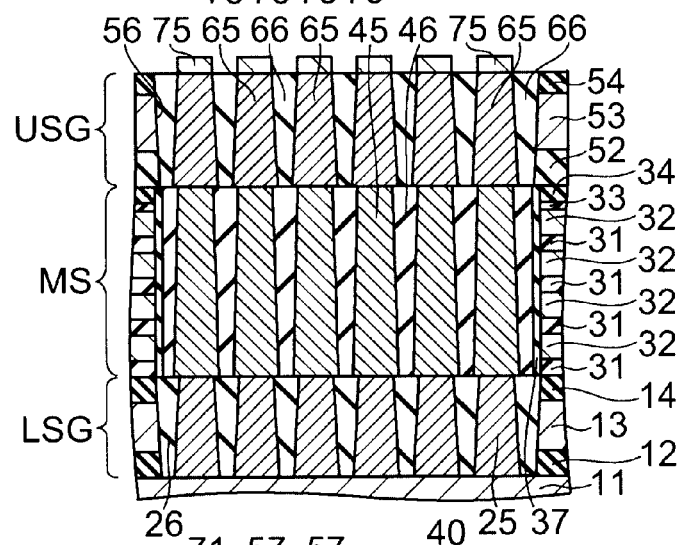
FIG. 26B is a process cross-sectional view taken along line A-A' shown in FIG. 26A.
Figure 26C:
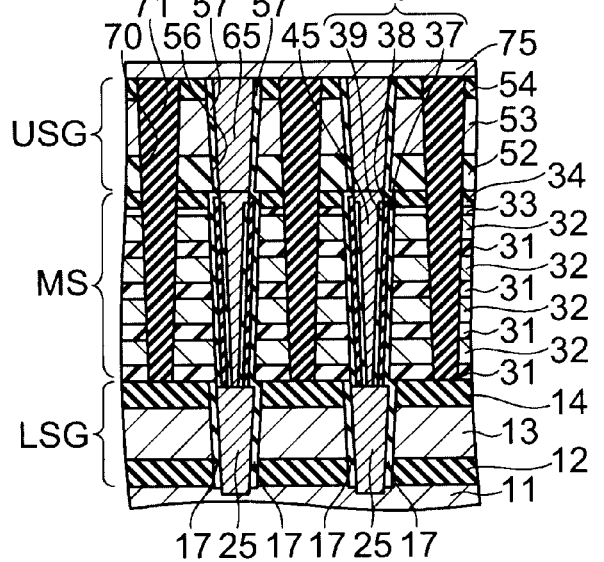
FIG. 26C is a process cross-sectional view taken along line B-B' shown in FIG. 26A.

Next, as shown in FIGS. 26A to 26C, a plurality of bit lines 75 made of a metal and extending in the bit line direction are formed on the upper select gate transistor section USG. The bit lines 75 are formed illustratively by the aforementioned sidewall transfer process with a width of 0.5 F and an arrangement pitch of 1 F. Thus, the bit line 75 is formed for each row of silicon pillars 65 arranged along the bit line direction, and is connected to the upper end portion of each silicon pillar 65. By the foregoing process, the nonvolatile semiconductor memory device 1 according to this embodiment is manufactured.

The nonvolatile semiconductor memory device 1 thus manufactured includes a lower select gate transistor section LSG, a memory cell section MS, and an upper select gate transistor section USG stacked in this order on a silicon substrate 11, and the memory cell section MS includes a multilayer body in which a plurality of dielectric films 31 and electrode films 32 are alternately stacked. This multilayer body includes trenches 36 extending in the word line direction, and a plurality of silicon pillars 45 are provided inside the trench 36. In each trench 36, a plurality of silicon pillars 45 are arranged in a row along the word line direction and spaced from each other. As viewed from above, each silicon pillar 45 is shaped like a rectangle. A memory film 40 including a charge storage film 38 is provided between the silicon pillar 45, and the dielectric film 31 and the electrode film 32. In the memory film 40, the charge storage film 38 and the tunnel film 39 are divided in the word line direction, and provided only in the bit line direction as viewed from each silicon pillar 45, and not provided in the word line direction.

Likewise, also in the lower select gate transistor section LSG, silicon pillars 25 are arranged along the word line direction and spaced from each other in the trench 16. A gate dielectric film 17 is provided between the silicon pillar 25 and the lower gate electrode film 13 and the like. The gate dielectric film 17 is divided in the word line direction, and provided only in the bit line direction as viewed from each silicon pillar 25, and not provided in the word line direction.

Also in the upper select gate transistor section USG, silicon pillars 65 are arranged along the word line direction and spaced from each other in the trench 56. A gate dielectric film 57 is provided between the silicon pillar 65 and the upper gate electrode film 53 and the like. The gate dielectric film 57 is divided in the word line direction, and provided only in the bit line direction as viewed from each silicon pillar 65, and not provided in the word line direction.

Next, the operation and effect of this embodiment are described.

In the nonvolatile semiconductor memory device 1 according to this embodiment, trenches 16 extending in the word line direction are formed in the process shown in FIGS. 2A and 2B, a gate dielectric film 17 and a silicon body 19 are formed in the trench 16 in the process shown in FIGS. 3A to 5B, and the silicon body 19 is divided into silicon pillars 25 with a pitch of 1 F by the sidewall transfer process in the process shown in FIGS. 6 to 10B. The memory cell section and the upper select gate transistor section are also formed by a similar method.

Thus, according to this embodiment, the space for forming the silicon pillar is not hole-shaped but line-shaped. Hence, with regard to the line direction (word line direction), it is only necessary to simply divide the charge storage film and the gate dielectric film and the silicon body, which enables downscaling to the limit of lithography and other processing techniques. For example, the arrangement pitch of the silicon pillars can be set to 1 F by making full use of the sidewall transfer process. Consequently, the length of the memory cell in the word line direction is 1 F. On the other hand, in the process shown in FIGS. 2A and 2B, the trenches 16 are formed with an arrangement pitch of 3.5 F in the bit line direction. Hence, the length of the memory cell in the bit line direction is 3.5 F. Thus, the memory cell has an area of 3.5 $F^2$.

The foregoing effect can be described from the viewpoint of the configuration as follows. In this embodiment, the charge storage film and the gate dielectric film are not provided in the word line direction as viewed from each silicon pillar. Hence, in the word line direction, there is no need to allocate space for the charge storage film and the gate dielectric film. Thus, the length of the memory cell in the word line direction can be set to the minimum length capable of separating the silicon pillars from each other.

Furthermore, in this embodiment, in the word line direction, the charge storage film 38 is divided for each silicon pillar 45. Hence, reduction of the length of the memory cell in the word line direction does not cause charge migration between the memory cells through the charge storage film 38. This can prevent interference between the memory cells arranged in the word line direction, hence achieving good charge retention characteristics and resistance to miswriting.

Moreover, in this embodiment, each silicon pillar is in contact with the memory film and the gate dielectric film at two surfaces facing in the bit line direction. Hence, as compared with the case of being in contact with the memory film and the gate dielectric film at only one surface, this embodiment is superior in the characteristics of writing and reading information in the memory cell and the controlling characteristics of the upper and lower select gate transistor.

Next, a comparative example of this embodiment is described.

Figure 27:
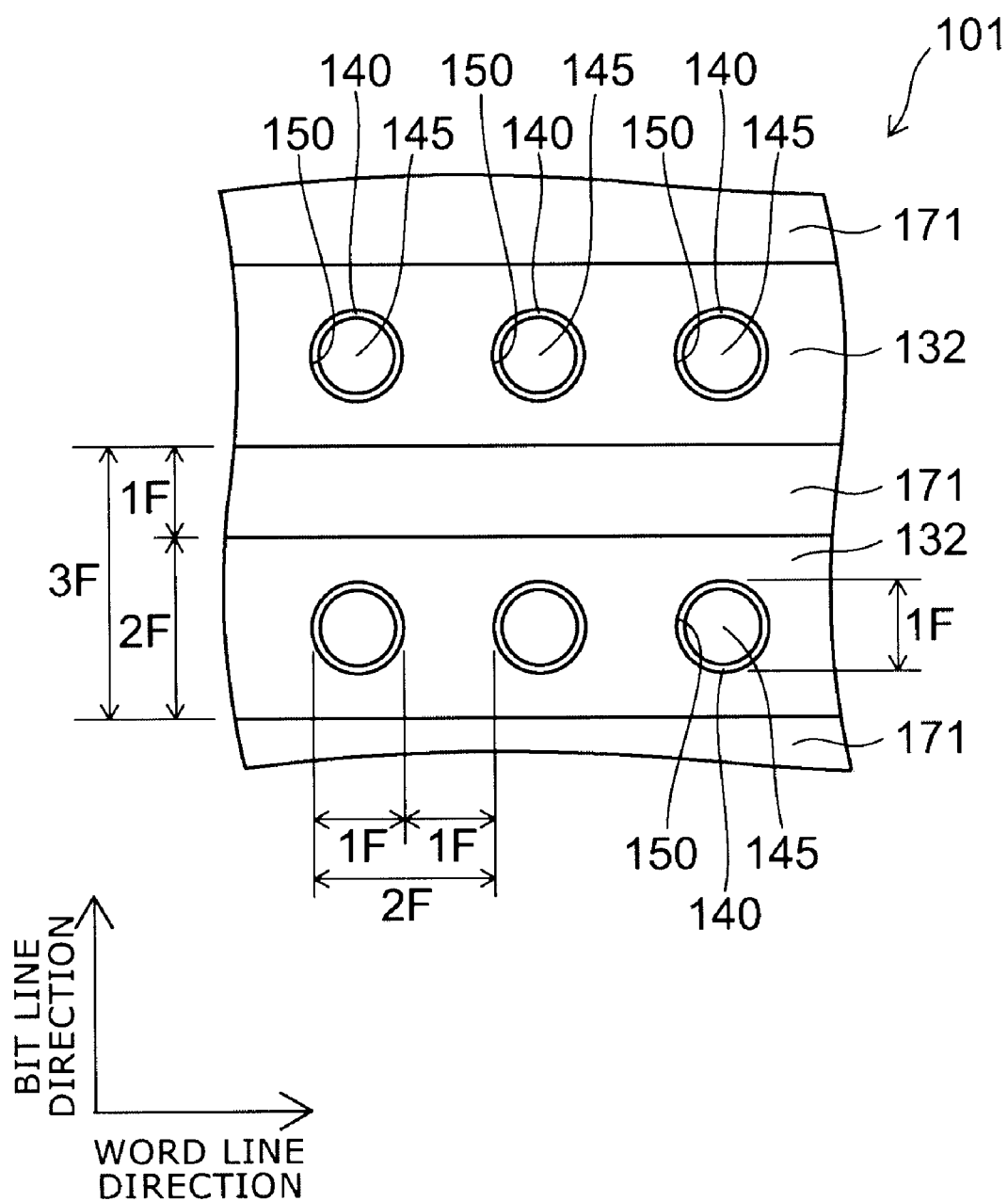
FIG. 27 is a plan view illustrating a nonvolatile semiconductor memory device according to a comparative example.

FIG. 27 is a plan view illustrating a nonvolatile semiconductor memory device according to this comparative example.

As shown in FIG. 27, in the nonvolatile semiconductor memory device 101 according to this comparative example, a plurality of electrode films 132 extend in the word line direction, and the electrode films 132 are separated from each other by silicon oxide 171. Through holes 150 are formed through the electrode film 132, and a silicon pillar 145 is provided inside the through hole 150. A memory film 140 is provided around the silicon pillar 145. The memory film 140 is formed from a block film, a charge storage film, and a tunnel film.

If the diameter of the through hole 150 is the minimum processing dimension F, the width of the electrode film 132 needs to be 2 F or more to form the through hole 150 therein. Furthermore, the width of the silicon oxide 171 provided between the electrode films 132 needs to be 1 F or more. Hence, in the nonvolatile semiconductor memory device according to this comparative example, the minimum length of the memory cell in the word line direction is 2 F, and the minimum length of the memory cell in the bit line direction is 3 F. Thus, the memory cell has an area of 6 $F^2$.

In this comparative example, the memory film 140 is formed entirely on the side surface of the through hole 150. Hence, the inner diameter of the through hole 150 must be larger than twice the thickness of the memory film 140. Furthermore, in the through hole 150, halfway through the formation process therefor, a protective film such as the aforementioned spacer film 18 (see FIGS. 4A and 4B) for protecting the silicon oxide film in the memory film from dilute hydrofluoric acid treatment needs to be formed. Hence, the thickness of the spacer film also needs to be taken into consideration to determine the inner diameter of the through hole 150. For example, if the memory film 140 has a thickness of 15 nm and the spacer film has a thickness of 5 nm, then the inner diameter of the through hole 150 needs to be larger than 40 nm. Thus, in this comparative example, the minimum processing dimension F is restricted not by the limit of the lithography technique, but by the thickness of the memory film.

As described above, this embodiment can reduce the area of the memory cell, which is 6 $F^2$ in the comparative example, to 3.5 $F^2$. Consequently, the nonvolatile semiconductor memory device can achieve a higher level of integration and higher capacity.

Next, a second embodiment of the invention is described.

Figure 28A:
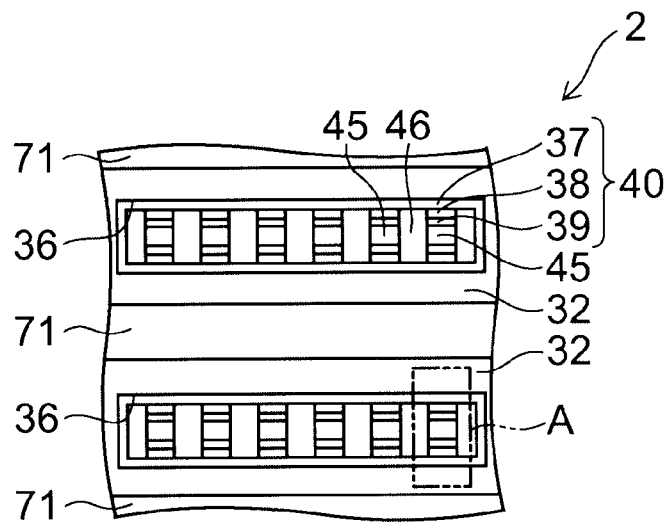
FIG. 28A is a plan view illustrating a nonvolatile semiconductor memory device according to a second embodiment of the invention.
Figure 28B:
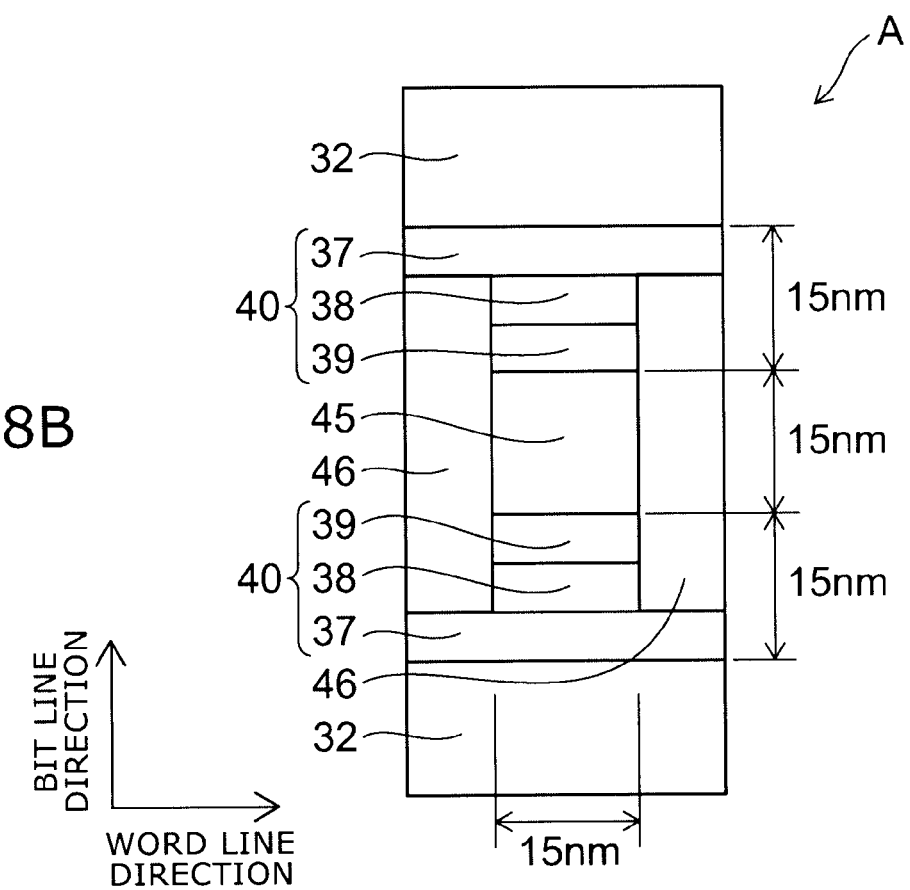
FIG. 28B is a plan view showing portion A shown in FIG. 28A.

FIG. 28A is a plan view illustrating a nonvolatile semiconductor memory device according to this embodiment, and FIG. 28B is a plan view showing portion A shown in FIG. 28A.

More particularly, FIGS. 28A and 28B show the memory cell section MS of the nonvolatile semiconductor memory device according to this embodiment.

As shown in FIGS. 28A and 28B, the nonvolatile semiconductor memory device 2 according to this embodiment has the same layered structure as that of the above first embodiment. In this embodiment, the minimum processing dimension F is 30 nm, and the thickness of the memory film 40 is 15 nm. In this case, the width of the trench 36, which is 1.5 F, is 45 nm, and the thickness of the memory film 40 is 15 nm on each side. Hence, the width of the silicon pillar 45 in the bit line direction is 15 nm (=45 nm−15 nm×2). On the other hand, the width of the silicon pillar 45 in the word line direction, which is 0.5 F, is 15 nm (=30 nm/2). Hence, as viewed from above, the silicon pillar 45 has a generally square shape. Thus, as compared with the case where the shape of the silicon pillar 45 as viewed from above is a rectangle with the longitudinal side aligned with the bit line direction, the ratio of the area of the surface of the silicon pillar 45 facing the electrode film 32 to the total surface area of the silicon pillar 45 is increased, which serves to enhance the channel controllability of the electrode film 32.

Furthermore, if the minimum processing dimension F is reduced to less than 30 nm with the thickness of the memory film 40 kept at 15 nm, then the shape of the silicon pillar 45 as viewed from above is a rectangle with the longitudinal side aligned with the word line direction, which serves to further enhance the channel controllability. Thus, the length of the silicon pillar 45 in the word line direction is preferably equal to or larger than the length of the silicon pillar in the bit line direction. The configuration, operation, and effect of this embodiment other than the foregoing are the same as those of the above first embodiment.

The invention has been described with reference to the embodiments. However, the invention is not limited to these embodiments. For example, those skilled in the art can suitably modify the above embodiments by addition, deletion, or design change of components, or by addition, omission, or condition change of processes, and such modifications are also encompassed within the scope of the invention as long as they fall within the spirit of the invention. For example, besides the films described in the above embodiments, it is possible to provide various films, such as an etching stopper film, a diffusion prevention film, a foundation film for improving matching with the overlying or underlying film or the substrate, depending on the need of the processes and characteristics. Furthermore, a preprocessing step, cleaning step, heating step and the like can be inserted as needed between the process steps. Furthermore, control circuits, interconnects and the like can be provided as needed around the lower select gate transistor section, the memory cell section, and the upper select gate transistor section described above.

The invention claimed is:

1. A nonvolatile semiconductor memory device comprising:
   a multilayer body with a plurality of dielectric films and a plurality of electrode films alternately stacked therein and a trench that extends in one direction orthogonal to the stacking direction being formed therein;
   semiconductor pillars arranged along the one direction and spaced from each other inside the trench; and
   a charge storage film provided between the electrode film and the semiconductor pillar,
   the charge storage film being divided in the one direction, and being not provided between a portion between the semiconductor pillars inside the trench, and the electrode film and the dielectric film.

2. The device according to claim 1, wherein the semiconductor pillar is shaped like a rectangle as viewed in the stacking direction.

3. The device according to claim 2, wherein the length of the semiconductor pillar in the one direction is equal to or larger than the length of the semiconductor pillar in a direction orthogonal to the stacking direction and the one direction.

4. The device according to claim 1, further comprising:
   a block film provided between the electrode film and the dielectric film, and the charge storage film; and
   a tunnel film provided between the charge storage film and the semiconductor pillar.

5. The device according to claim 4, wherein the block film is continuously formed along the one direction on an inner surface of the trench, and the tunnel film is divided in the one direction, and not provided between the portion between the semiconductor pillars inside the trench, and the electrode film and the dielectric film.

6. The device according to claim 1, wherein the electrode film and the dielectric film are divided for each row of the semiconductor pillars arranged along the one direction.

7. The device according to claim 1, further comprising:
   a substrate; and
   a lower select gate transistor section provided between the substrate and the multilayer body,
   wherein the lower select gate transistor section includes:
      a lower gate electrode film which a lower trench extending in the one direction is formed immediately below the trench therein;
      lower semiconductor pillars arranged along the one direction and spaced from each other inside the lower trench, and coupled to the semiconductor pillars; and
      a lower gate dielectric film provided between the lower gate electrode film and the lower semiconductor pillar, and
   the lower gate dielectric film is divided in the one direction, and not provided between a portion between the lower semiconductor pillars inside the lower trench, and the lower gate electrode film.

8. The device according to claim 7, wherein
   the electrode film and the dielectric film are divided for each row of the semiconductor pillars arranged along the one direction, and
   the lower gate electrode film is provided in common with a plurality of rows of the lower semiconductor pillars arranged along the one direction.

9. The device according to claim 1, further comprising:
   an upper select gate transistor section provided on the multilayer body,
   wherein the upper select gate transistor section includes:
      an upper gate electrode film which an upper trench extending in the one direction is formed immediately above the trench therein;
      upper semiconductor pillars arranged along the one direction and spaced from each other inside the upper trench, and coupled to the semiconductor pillars; and
      an upper gate dielectric film provided between the upper gate electrode film and the upper semiconductor pillar, and
   the upper gate dielectric film is divided in the one direction, and not provided between a portion between the upper semiconductor pillars inside the upper trench, and the upper gate electrode film.

10. The device according to claim 9, wherein
    the electrode film and the dielectric film are divided for each row of the semiconductor pillars arranged along the one direction, and
    the upper gate electrode film is divided for each row of the upper semiconductor pillars arranged along the one direction.

11. The device according to claim 1, further comprising:
    a dielectric material buried between the semiconductor pillars inside the trench,
    wherein a portion of the dielectric material being in contact with a side surface of the semiconductor pillar in the one direction is an oxide of a semiconductor material forming the semiconductor pillar.

* * * * *